(12) United States Patent
Watanabe et al.

(10) Patent No.: US 9,057,949 B2
(45) Date of Patent: Jun. 16, 2015

(54) PATTERNING PROCESS, RESIST COMPOSITION, POLYMER, AND POLYMERIZABLE ESTER COMPOUND

(71) Applicant: SHIN-ETSU CHEMICAL CO., LTD., Tokyo (JP)

(72) Inventors: Takeru Watanabe, Joetsu (JP); Tomohiro Kobayashi, Joetsu (JP); Jun Hatakeyama, Joetsu (JP); Kazuhiro Katayama, Joetsu (JP); Takeshi Kinsho, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 139 days.

(21) Appl. No.: 13/707,075

(22) Filed: Dec. 6, 2012

(65) Prior Publication Data

US 2013/0157194 A1 Jun. 20, 2013

(30) Foreign Application Priority Data

Dec. 15, 2011 (JP) .................................. 2011-273949

(51) Int. Cl.
| | |
|---|---|
| G03F 7/039 | (2006.01) |
| G03F 7/32 | (2006.01) |
| G03F 7/004 | (2006.01) |
| C08F 20/10 | (2006.01) |
| G03F 7/20 | (2006.01) |
| C08F 220/28 | (2006.01) |
| C08F 232/08 | (2006.01) |

(52) U.S. Cl.
CPC .............. *G03F 7/004* (2013.01); *G03F 7/0392* (2013.01); *C08F 20/10* (2013.01); *G03F 7/0395* (2013.01); *G03F 7/0397* (2013.01); *G03F 7/2041* (2013.01); *G03F 7/325* (2013.01); *C08F 220/28* (2013.01); *C08F 232/08* (2013.01)

(58) Field of Classification Search
CPC ....... G03F 7/004; G03F 7/039; G03F 7/0392; G03F 7/20; G03F 7/2002; G03F 7/32; G03F 7/325; G03F 7/0395; G03F 7/0397; G03F 7/2041
USPC ................................ 430/270.1, 326, 434, 435
See application file for complete search history.

(56) References Cited

U.S. PATENT DOCUMENTS

| 5,650,483 A | 7/1997 | Malik et al. | |
|---|---|---|---|
| 7,129,017 B2 * | 10/2006 | Yamamoto et al. | ........ 430/270.1 |
| 7,537,880 B2 | 5/2009 | Harada et al. | |
| 7,759,047 B2 | 7/2010 | Hatakeyama et al. | |
| 7,998,655 B2 | 8/2011 | Tsubaki | |
| 8,017,298 B2 | 9/2011 | Tsubaki | |
| 8,034,547 B2 | 10/2011 | Tsubaki et al. | |
| 8,268,528 B2 | 9/2012 | Harada et al. | |
| 2001/0024763 A1 | 9/2001 | Choi et al. | |
| 2002/0150834 A1 | 10/2002 | Yamamoto et al. | |
| 2003/0194643 A1 | 10/2003 | Choi | |
| 2004/0137363 A1 | 7/2004 | Choi et al. | |
| 2005/0175936 A1 | 8/2005 | Yamamoto et al. | |
| 2007/0003867 A1 | 1/2007 | Hatakeyama et al. | |
| 2008/0090172 A1 | 4/2008 | Hatakeyama et al. | |
| 2008/0187860 A1 * | 8/2008 | Tsubaki et al. | ............ 430/270.1 |
| 2012/0058436 A1 | 3/2012 | Tsubaki et al. | |
| 2012/0270159 A1 * | 10/2012 | Kobayashi et al. | ........... 430/325 |
| 2013/0071788 A1 | 3/2013 | Hatakeyama et al. | |

FOREIGN PATENT DOCUMENTS

| JP | 2001-200016 A | 7/2001 |
|---|---|---|
| JP | 2002-311587 A | 10/2002 |
| JP | 2003-330194 A | 11/2003 |
| JP | 2007-025634 A | 2/2007 |
| JP | 2008-003569 A | 1/2008 |
| JP | 2008-111103 A | 5/2008 |
| JP | 2008-122932 A | 5/2008 |
| JP | 2008-281974 A | 11/2008 |
| JP | 2008-281975 A | 11/2008 |
| JP | 2008-309878 A | 12/2008 |
| JP | 2008-309879 A | 12/2008 |
| JP | 2010-134012 A | 6/2010 |
| JP | 4554665 B2 | 9/2010 |
| JP | 2012-194757 A | 10/2012 |
| WO | WO 2010/095763 * | 8/2010 |

OTHER PUBLICATIONS

Machine translation of JP 2003-330194, published on Nov. 19, 2003.*
Japanese Office Action dated Sep. 9, 2014, issued in corresponding Japanese Patent Application No. 2011-273949 (4 pages).

* cited by examiner

*Primary Examiner* — Anca Eoff

(74) *Attorney, Agent, or Firm* — Westerman, Hattori, Daniels & Adrian, LLP

(57) ABSTRACT

A negative pattern is formed by applying a resist composition onto a substrate, prebaking, exposing to high-energy radiation, baking (PEB), and developing the exposed resist film in an organic solvent developer to dissolve the unexposed region of resist film. The resist composition comprising a polymer adapted to form a lactone ring under the action of an acid so that the polymer may reduce its solubility in an organic solvent developer, an acid generator, and an organic solvent displays a high dissolution contrast between the unexposed region of promoted dissolution and the exposed region of inhibited dissolution.

4 Claims, 2 Drawing Sheets

PATTERNING PROCESS, RESIST COMPOSITION, POLYMER, AND POLYMERIZABLE ESTER COMPOUND

CROSS-REFERENCE TO RELATED APPLICATION

This non-provisional application claims priority under 35 U.S.C. §119(a) on Patent Application No. 2011-273949 filed in Japan on Dec. 15, 2011, the entire contents of which are hereby incorporated by reference.

TECHNICAL FIELD

This invention relates to a radiation-sensitive chemically amplified resist composition which is advantageously used in the micropatterning lithography using a variety of radiations including deep-UV, typically KrF and ArF excimer lasers, extreme ultraviolet (EUV), x-ray, typically synchrotron radiation, and charged particle beam, typically electron beam, and a pattern forming process using the same. More particularly, it relates to a pattern forming process involving exposure of resist film, modification of base resin by chemical reaction with the aid of acid and heat, and development in an organic solvent to form a negative tone pattern in which the unexposed region is dissolved and the exposed region is not dissolved; a resist composition for use in the process; a polymer; and a polymerizable ester compound.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized edge roughness (LER, LWR) of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The organic solvent development to form a negative pattern is a traditional technique. A resist composition comprising cyclized rubber is developed using an alkene such as xylene as the developer. An early chemically amplified resist composition comprising poly(tert-butoxycarbonyloxystyrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkaline development and organic solvent development is under study.

As the ArF resist composition for negative tone development with organic solvent, positive ArF resist compositions of the prior art design may be used. Such pattern forming processes are described in Patent Documents 1 to 3. These patent documents disclose resist compositions for organic solvent development comprising a copolymer of hydroxyadamantane methacrylate, a copolymer of norbornane lactone methacrylate, and a copolymer of methacrylate having acidic groups including carboxyl, sulfo, phenol and thiol groups substituted with two or more acid labile groups, and pattern forming processes using the same.

Further, Patent Document 4 discloses a process for forming a pattern through organic solvent development in which a protective film is applied onto a resist film. Patent Document 5 discloses a topcoatless process for forming a pattern through organic solvent development in which an additive is added to a resist composition so that the additive may segregate at the resist film surface after spin coating to provide the surface with improved water repellency.

CITATION LIST

Patent Document 1: JP-A 2008-281974
Patent Document 2: JP-A 2008-281975
Patent Document 3: JP 4554665
Patent Document 4: JP-A 2008-309878
Patent Document 5: JP-A 2008-309879

DISCLOSURE OF INVENTION

As compared with the positive resist system which becomes dissolvable in alkaline developer as a result of acidic carboxyl or analogous groups generating through deprotection reaction, the organic solvent development provides a low dissolution contrast. The alkaline developer provides an alkaline dissolution rate that differs by a factor of 1,000 or more between the unexposed and exposed regions whereas the organic solvent development provides a dissolution rate difference of only about 10 times. While Patent Documents 1 to 5 describe conventional photoresist compositions of the alkaline aqueous solution development type, there is a demand for a novel material which can offer a significant dissolution contrast upon organic solvent development. That is, a strong demand exists for a material capable of providing the unexposed region of promoted dissolution and the exposed region of retarded dissolution in an organic solvent developer.

An object of the invention is to provide a pattern forming process involving organic solvent development for forming a negative tone pattern having a significant dissolution contrast between the unexposed region of promoted dissolution and the exposed region of retarded dissolution. Another object is to provide a resist composition for use in the process; a polymer; and a polymerizable ester compound.

The inventors have found that the dissolution contrast during organic solvent development is improved using a polymer adapted to form a lactone ring under the action of an acid so that the polymer may reduce its solubility in an organic solvent developer.

In one aspect, the invention provides a pattern forming process comprising the steps of applying a resist composition comprising a polymer adapted to form a lactone ring under the action of an acid so that the polymer may reduce its solubility in an organic solvent developer, an acid generator, and an organic solvent onto a substrate, prebaking the composition to form a resist film, exposing the resist film to high-energy radiation, baking, and developing the exposed film in an organic solvent-based developer to form a negative pattern wherein the unexposed region of film is dissolved away and the exposed region of film is not dissolved.

Another embodiment is a pattern forming process comprising the steps of applying a resist composition comprising a polymer adapted to undergo deprotection reaction under the action of an acid, to form a hydroxyl group, which in turn, reacts with any neighboring ester or acid anhydride to form a lactone ring so that the polymer may reduce its solubility in an organic solvent developer, an acid generator, and an organic solvent onto a substrate, prebaking the composition to form a resist film, exposing the resist film to high-energy radiation, baking, and developing the exposed film in an organic solvent-based developer to form a negative pattern wherein the unexposed region of film is dissolved away and the exposed region of film is not dissolved.

In a preferred embodiment, the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

Preferably, the step of exposing the resist film to high-energy radiation includes ArF excimer laser lithography of 193 nm wavelength, EUV lithography of 13.5 nm wavelength or EB lithography.

In a second aspect, the invention provides a negative pattern-forming resist composition comprising a polymer, an acid generator, and an organic solvent, wherein the polymer is soluble in an organic solvent developer as specified above, and adapted to form a lactone ring under the action of an acid so that the polymer may reduce its solubility in the developer.

Preferably the polymer is adapted to undergo deprotection reaction under the action of an acid, to form a hydroxyl group, which in turn, reacts with any neighboring ester or acid anhydride to form a lactone ring so that the polymer may reduce its solubility in the organic solvent developer.

More preferably the polymer adapted to undergo deprotection reaction under the action of an acid, to form a hydroxyl group, which in turn, reacts with any neighboring ester or acid anhydride to form a lactone ring so that the polymer may reduce its solubility in the organic solvent developer comprises recurring units of at least one type selected from the general formulae (1) to (3):

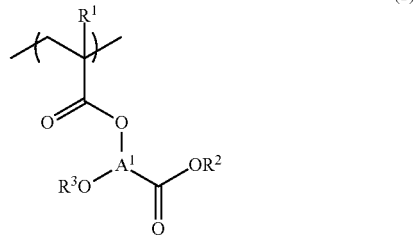

(1)

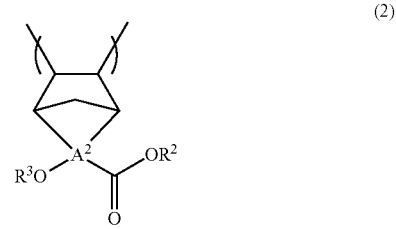

(2)

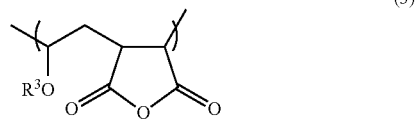

(3)

wherein $R^1$ is hydrogen or methyl, $R^2$ is a $C_1$-$C_{20}$ alkyl group which may contain an oxygen functional group, $R^3$ is a $C_2$-$C_{20}$ acid labile group which may contain an oxygen functional group, $A^1$ is a trivalent $C_3$-$C_{20}$ organic group which may contain an oxygen functional group, and $A^2$ is a tetravalent $C_3$-$C_{20}$ organic group which may contain an oxygen functional group.

In a third aspect, the invention provides a polymer comprising recurring units having the general formula (1) or (2):

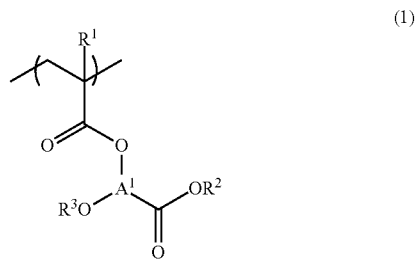

(1)

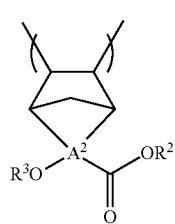

(2)

wherein $R^1$ is hydrogen or methyl, $R^2$ is a $C_1$-$C_{20}$ alkyl group which may contain an oxygen functional group, $R^3$ is a $C_2$-$C_{20}$ acid labile group which may contain an oxygen functional group, $A^1$ is a trivalent $C_3$-$C_{20}$ organic group which may contain an oxygen functional group, and $A^2$ is a tetravalent $C_3$-$C_{20}$ organic group which may contain an oxygen functional group. The polymer is adapted to undergo deprotection reaction under the action of an acid, to form a hydroxyl group, which in turn, reacts with any neighboring ester or acid anhydride to form a lactone ring so that the polymer may reduce its solubility in an organic solvent developer.

The polymer preferably comprises at least 5 mol % of the recurring units having formula (1) or (2) based on the entire recurring units, and has a weight average molecular weight of 1,000 to 100,000.

In a fourth aspect, the invention provides a polymerizable ester compound having the general formula (1a):

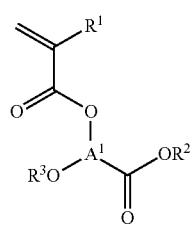

(1a)

wherein $R^1$ is hydrogen or methyl, $R^2$ is a $C_1$-$C_{20}$ alkyl group which may contain an oxygen functional group, $R^3$ is a $C_2$-$C_{20}$ acid labile group which may contain an oxygen functional group, and $A^1$ is a trivalent $C_3$-$C_{20}$ organic group which may contain an oxygen functional group.

Advantageous Effects of Invention

In the process of image formation via positive/negative reversal by organic solvent development, a photoresist film comprising a polymer adapted to form a lactone ring under the action of an acid and an acid generator is characterized by a high dissolution contrast between the unexposed region of promoted dissolution and the exposed region of inhibited dissolution. By subjecting the photoresist film to exposure and organic solvent development, a negative tone pattern can be formed at a high contrast.

BRIEF DESCRIPTION OF DRAWINGS

FIG. 1 is a cross-sectional view of a patterning process according one embodiment of the invention.

DESCRIPTION OF EMBODIMENTS

Figure 1A:
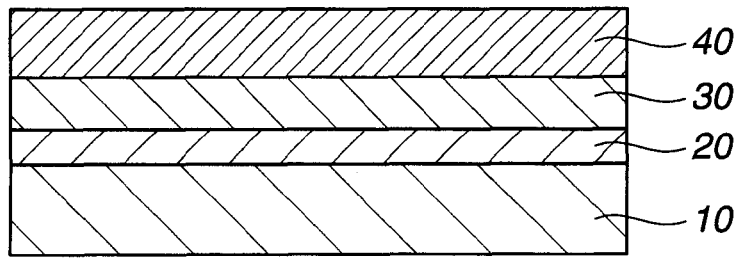
FIG. 1A shows a photoresist film disposed on a substrate.

The terms "a" and "an" herein do not denote a limitation of quantity, but rather denote the presence of at least one of the referenced item. As used herein, the notation ($C_n$-$C_m$) means a group containing from n to m carbon atoms per group. As used herein, the term "film" is used interchangeably with "coating" or "layer."

The abbreviations and acronyms have the following meaning.
Mw: weight average molecular weight
Mn: number average molecular weight
Mw/Mn: molecular weight distribution or dispersity
GPC: gel permeation chromatography
PEB: post-exposure bake
PAG: photoacid generator
Me: methyl Also, as used herein, the term "organic solvent solubility" refers to the solubility of a polymer in an organic solvent.

Briefly stated, the invention pertains to a pattern forming process comprising the steps of applying a resist composition comprising a polymer adapted to form a lactone ring under the action of an acid so that the polymer may reduce its solubility in an organic solvent developer, an acid generator and an organic solvent onto a substrate, prebaking to form a resist film, exposing to high-energy radiation for letting the acid generator generate an acid and the polymer form a lactone ring, for thereby reducing the solubility of the exposed region in an organic solvent-based developer, PEB, and developing in an organic solvent-based developer to form a negative pattern. The invention also pertains to a resist composition, a polymer, and a polymerizable ester compound.

It is generally known that lactone ring-containing polymers are less soluble in organic solvents. The polymer used in the pattern forming process of the invention is designed such that, under the action of the generated acid, it may form a lactone ring selectively in the exposed region and thus reduce its solubility in organic solvents. This ensures that the film remains as a pattern. A change of lactone content before and after exposure brings about a substantial difference in dissolution rate, achieving a high dissolution contrast upon organic solvent development. Although no or little studies have been made on the polymers adapted to form a lactone ring under the action of acid because they are least soluble in alkaline developer, the inventors have found that the lactone ring formation is effective for tuning organic solvent solubility in the case of organic solvent development.

Great efforts are currently made to apply organic solvent development to ArF resist compositions. In these ArF resist compositions, lactone units are incorporated into the base resin in as large a proportion as 30 to 60 mol % in order to ensure the adhesion of pattern to substrate. This restricts the solubility of the base resin itself in organic solvents and makes it essentially difficult to provide the unexposed region with the desired high dissolution rate. By contrast, the polymer used in the pattern forming process of the invention is characterized in that a lactone ring is newly formed in the exposed region where the film is to be left as pattern and contributes to substrate adhesion. This enables to reduce the amount of lactone initially introduced into the base resin and is effective in enhancing the dissolution rate of the base resin in the unexposed region.

It is preferred that the polymer used in the pattern forming process of the invention contain an acid labile ether group and a carboxylic acid derivative in some or all recurring units. Suitable carboxylic acid derivatives include carboxylic acids, carboxylic anhydrides, carboxylic acid esters, and carboxylic acid salts, with acyclic esters and acid anhydrides being preferred. The preferred lactone forming mechanism is that the acid labile ether group undergoes deprotection reaction under the action of an acid to form a hydroxyl group, which in turn, undergoes transesterification reaction with any neighboring ester or acylation reaction with any neighboring acid anhydride to form a lactone ring. The inclusion of the ether group and the acyclic ester group or acid anhydride is advantageous for the organic solvent solubility of the base resin in the unexposed region because many polymers containing them have increased organic solvent solubility. In the exposed region, the PAG generates an acid to extinguish the ether group and the acyclic ester group or acid anhydride and instead, form a lactone ring, whereby the solubility in organic solvent is dramatically reduced, achieving a higher dissolution contrast. The lactone ring thus formed is preferably 5-, 6- or 7-membered ring lactone. Other lactone forming mechanisms contemplated herein include a reaction of unprotected hydroxyl group with carboxyl group, a reaction of unprotected hydroxyl group with ester group, and a reaction of carboxyl group with double bond. However, the unprotected hydroxyl group and carboxyl group are not so preferred herein because they are known to reduce the organic solvent solubility of polymers containing them and inevitably, the base resin containing them has inferior organic solvent solubility.

Preferably, the polymer used herein comprises recurring units of at least one type selected from the general formulae (1) to (3).

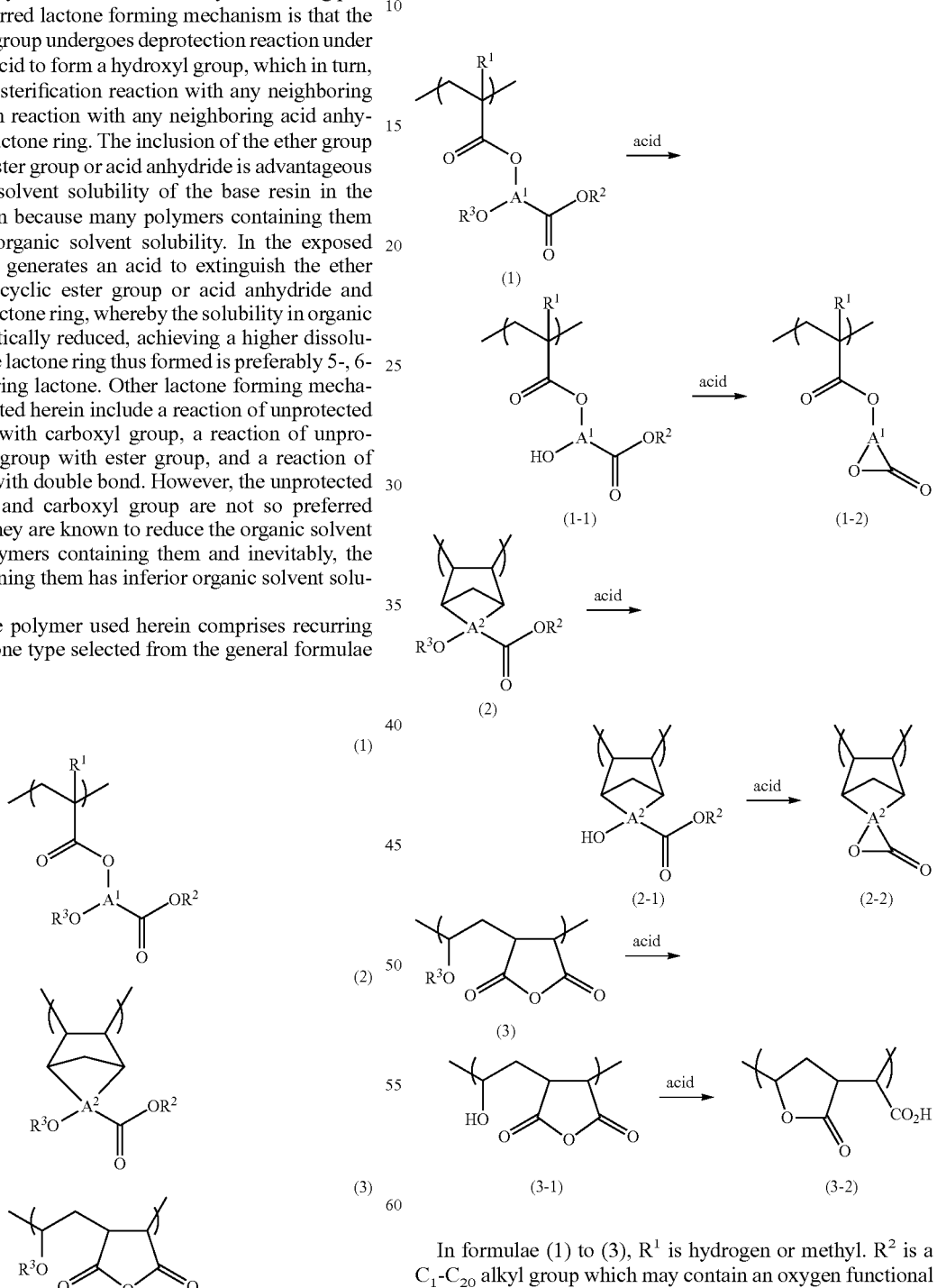

Herein $R^1$ is hydrogen or methyl, $R^2$ is a $C_1$-$C_{20}$ alkyl group which may contain an oxygen functional group, $R^3$ is a $C_2$-$C_{20}$ acid labile group which may contain an oxygen functional group, $A^1$ is a trivalent $C_3$-$C_{20}$ organic group which may contain an oxygen functional group, and $A^2$ is a tetravalent $C_3$-$C_{20}$ organic group which may contain an oxygen functional group.

It is presumed that recurring units having formulae (1) to (3) form a lactone ring under the action of acid according to the following schemes wherein $R^1$, $R^2$, $R^3$, $A^1$ and $A^2$ are as defined above.

In formulae (1) to (3), $R^1$ is hydrogen or methyl. $R^2$ is a $C_1$-$C_{20}$ alkyl group which may contain an oxygen functional group. The alkyl group of $R^2$ may be straight, branched or cyclic, and the optional oxygen functional group is preferably ether, ester or carbonyl group. Examples of $R^2$ include, but are not limited to, methyl, ethyl, propyl, isopropyl, butyl, isobutyl, sec-butyl, tert-butyl, pentyl, neopentyl, cyclopentyl, hexyl, cyclohexyl, heptyl, 2-ethylhexyl, nonyl, undecyl, tridecyl, pentadecyl, heptadecyl, adamantyl, adamantylmethyl, norbornyl, norbornylmethyl, tricyclodecanyl, tetracyclododecanyl, tetracyclododecanylmethyl, dicyclohexylmethyl, eicosanyl, allyl, tetrahydrofuryl, methoxymethyl, ethoxymethyl, trifluoromethyl, (2-methoxyethoxy)methyl, and acetoxymethyl. Inter alia, methyl and ethyl are preferred as $R^2$.

In formulae (1) to (3), $R^3$ is a $C_2$-$C_{20}$ acid labile group which may contain an oxygen functional group. The acid labile group of $R^3$ may be selected from a variety of such groups, preferably $C_2$-$C_{30}$ acetal groups of the formula (C1) and $C_4$-$C_{30}$ tertiary alkyl groups of the formula (C2).

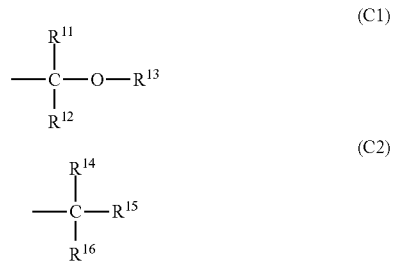

In formulae (C1) and (C2), $R^{11}$ and $R^{12}$ are each independently hydrogen or a straight, branched or cyclic alkyl group of 1 to 18 carbon atoms, preferably 1 to 12 carbon atoms, optionally containing oxygen; $R^{13}$, $R^{14}$, $R^{15}$, and $R^{16}$ are each independently a straight, branched or cyclic alkyl, aryl or aralkyl group of 1 to 17 carbon atoms, preferably 1 to 12 carbon atoms, optionally containing oxygen, or a pair of $R^{11}$ and $R^{12}$, $R^{11}$ and $R^{13}$, $R^{12}$ and $R^{13}$, $R^{14}$ and $R^{15}$, $R^{14}$ and $R^{16}$, or $R^{15}$ and $R^{16}$ may bond together to form a non-aromatic ring of 3 to 20 carbon atoms, preferably 3 to 12 carbon atoms with the carbon and oxygen atoms to which they are attached.

Illustrative examples of the acetal group of formula (C1) include, but are not limited to, methoxymethyl, ethoxymethyl, propoxymethyl, butoxymethyl, isopropoxymethyl, tert-butoxymethyl, neopentyloxymethyl, (1-methylcyclohexyl)methoxymethyl, 2-adamantyloxymethyl, (1-adamantyl)methoxymethyl, fenchyloxymethyl, (2-methyl-2-norbornyl)methoxymethyl, 1-methoxyethyl, 1-methoxypropyl, 1-methoxybutyl, 1-ethoxyethyl, 1-ethoxypropyl, 1-ethoxybutyl, 1-propoxyethyl, 1-propoxypropyl, 1-propoxybutyl, 1-cyclopentyloxyethyl, 1-cyclohexyloxyethyl, 2-methoxyisopropyl, 2-ethoxyisopropyl, 1-methoxy-2-methylpropyl, 1-phenoxyethyl, 1-benzyloxyethyl, 1-phenoxypropyl, 1-benzyloxypropyl, 1-adamantyloxyethyl, 1-adamantyloxypropyl, 2-tetrahydrofuryl, 2-tetrahydro-2H-pyranyl, 1-(2-cyclohexanecarbonyloxyethoxy)ethyl, 1-(2-cyclohexanecarbonyloxyethoxy)propyl, 1-[2-(1-adamantylcarbonyloxy)ethoxy]ethyl, 1-[2-(1-adamantylcarbonyloxy)ethoxy]propyl, 1-(2-phenoxyethoxy)ethyl, 1-(2-benzoyloxyethoxy)ethyl, and 1-[2-(1-adamantanecarbonyloxy)ethoxy]ethyl.

Illustrative examples of the tertiary alkyl group of formula (C2) include, but are not limited to, tert-butyl, tert-pentyl, 1-ethyl-1-methylpropyl, 1,1-diethylpropyl, 1,1,2-trimethylpropyl, 1-adamantyl-1-methylethyl, 1-methyl-1-(2-norbornyl)ethyl, 1-methyl-1-(tetrahydrofuran-2-yl)ethyl, 1-methyl-1-(7-oxanorbornan-2-yl)ethyl, 1-methylcyclopentyl, 1-ethylcyclopentyl, 1-propylcyclopentyl, 1-cyclopentylcyclopentyl, 1-cyclohexylcyclopentyl, 1-(2-tetrahydrofuryl)cyclopentyl, 1-(7-oxanorbornan-2-yl)cyclopentyl, 1-methyl- cyclohexyl, 1-ethylcyclohexyl, 1-cyclopentylcyclohexyl, 1-cyclohexylcyclohexyl, 2-methyl-2-norbornyl, 2-ethyl-2-norbornyl, 8-methyl-8-tricyclo[5.2.1.0$^{2,6}$]decyl, 8-ethyl-8-tricyclo[5.2.1.0$^{2,6}$]decyl, 3-methyl-3-tetracyclo[4.4.0.1$^{2,5}$.1$^{7,10}$]dodecyl, 3-ethyl-3-tetracyclo[4.4.0.1$^{2,5}$.1$^{7,10}$]dodecyl, 2-methyl-2-adamantyl, 2-ethyl-2-adamantyl, 1-methyl-3-oxo-1-cyclohexyl, 1-methyl-1-(tetrahydrofuran-2-yl)ethyl, 5-hydroxy-2-methyl-2-adamantyl, 5-hydroxy-2-ethyl-2-adamantyl, 1-ethyl-1-phenylethyl, and 1,1-diphenylethyl.

In formula (1), $A^1$ is a trivalent $C_3$-$C_{20}$ organic group which may contain an oxygen functional group. Exemplary groups $A^1$ are trivalent organic groups obtained by eliminating three hydrogen atoms from the following compounds of 3 to 20 carbon atoms ($A^1$+3H). Examples of the compounds ($A^1$+3H) include, but are not limited to, propane, butane, isobutene, cyclobutane, pentane, methylpentane, neopentane, dimethylbutane, cyclopentane, methylcyclopentane, ethylcyclopentane, dimethylcyclopentane, dimethylpentane, ethylpentane, hexane, isohexane, cyclohexane, methylcyclohexane, ethylcyclohexane, dimethylcyclohexane, trimethylcyclohexane, methylhexane, dimethylhexane, ethylcyclohexane, heptane, methylheptane, dimethylheptane, norbornane, methylnorbornane, dimethylnorbornane, ethylnorbornane, octane, methyloctane, dimethyloctane, ethyloctane, bicyclo[2.2.2]octane, methylbicyclo[2.2.2]octane, dimethylbicyclo[2.2.2]octane, ethylbicyclo[2.2.2]octane, bicyclo[3.3.0]octane, methylbicyclo[3.3.0]octane, dimethylbicyclo[3.3.0]octane, ethylbicyclo[3.3.0]octane, nonane, methylnonane, decane, methyldecane, adamantane, methyladamantane, dimethyladamantane, tricyclo[5.2.1.0$^{1,5}$]decane, methyltricyclo[5.2.1.0$^{1,5}$]decane, ethyltricyclo[5.2.1.0$^{1,5}$]decane, dimethyltricyclo[5.2.1.0$^{1,5}$]decane, tetracyclo[4.4.0.1$^{2,5}$.1$^{7,10}$]dodecane, methyltetracyclo[4.4.0.1$^{2,5}$.1$^{7,10}$]dodecane, dimethylmethyltetracyclo[4.4.0.1$^{2,5}$.1$^{7,10}$]dodecane, ethylmethyltetracyclo[4.4.0.1$^{2,5}$.1$^{7,10}$]dodecane, eicosane, diethyl ether, ethyl propyl ether, 3-pentanone, 2-pentanone, tetrahydrofuran, tetrahydropyran, ethyl acetate, propyl acetate, butyl acetate, cyclopentyl acetate, cyclohexyl acetate, norbornyl acetate, 7-oxanorbornane, methoxycarbonylcyclohexane, methoxycarbonylnorbornane, butyl cyclohexanecarboxylate, toluene, ethylbenzene, xylene, trimethylbenzene, methylnaphthalene, ethylnaphthalene, and dimethylnaphthalene.

In formula (2), $A^2$ is a tetravalent $C_3$-$C_{20}$ organic group which may contain an oxygen functional group. Exemplary groups $A^2$ are tetravalent organic groups obtained by eliminating four hydrogen atoms from the following compounds of 3 to 20 carbon atoms ($A^2$+4H). Examples of the compounds ($A^2$+4H) include, but are not limited to, propane, butane, isobutene, cyclobutane, pentane, methylpentane, neopentane, dimethylbutane, cyclopentane, methylcyclopentane, ethylcyclopentane, dimethylcyclopentane, dimethylpentane, ethylpentane, hexane, isohexane, cyclohexane, methylcyclohexane, ethylcyclohexane, dimethylcyclohexane, trimethylcyclohexane, methylhexane, dimethylhexane, ethylcyclohexane, heptane, methylheptane, dimethylheptane, norbornane, methylnorbornane, dimethylnorbornane, ethylnorbornane, octane, methyloctane, dimethyloctane, ethyloctane, bicyclo[2.2.2]octane, methylbicyclo[2.2.2]octane, dimethylbicyclo[2.2.2]octane, ethylbicyclo[2.2.2]octane, bicyclo[3.3.0]octane, methylbicyclo[3.3.0]octane, dimethylbicyclo[3.3.0]octane, ethylbicyclo[3.3.0]octane, nonane, methylnonane, decane, methyldecane, adamantane, methyladamantane, dimethyladamantane, tricyclo[5.2.1.0$^{1,5}$]decane, methyltricyclo[5.2.1.0$^{1,5}$]decane, ethyltricyclo[5.2.1.0$^{1,5}$]decane, dimethyltricyclo[5.2.1.0$^{1,5}$]decane, tetracyclo[4.4.0.1$^{2,5}$.1$^{7,10}$]dodecane, methyltetracyclo[4.4.0.1$^{2,5}$.1$^{7,10}$]dodecane, dimethylmethyltetracyclo[4.4.0.1$^{2,5}$.1$^{7,10}$]dodecane, ethylmethyltetracyclo[4.4.0.1$^{2,5}$.1$^{7,10}$]dodecane, eicosane, diethyl ether, ethyl propyl ether, 3-pentanone, 2-pentanone, tetrahydrofuran, tetrahydropyran, ethyl acetate, propyl acetate, butyl acetate, cyclopentyl acetate, cyclohexyl acetate, norbornyl acetate, 7-oxanorbornane, methoxycarbonylcyclohexane, methoxycarbonylnorbornane, butyl cyclohexanecarboxylate, toluene, ethylbenzene, xylene, trimethylbenzene, methylnaphthalene, ethylnaphthalene, and dimethylnaphthalene.

Examples of the recurring unit having formula (1) include the following structures, but are not limited thereto.

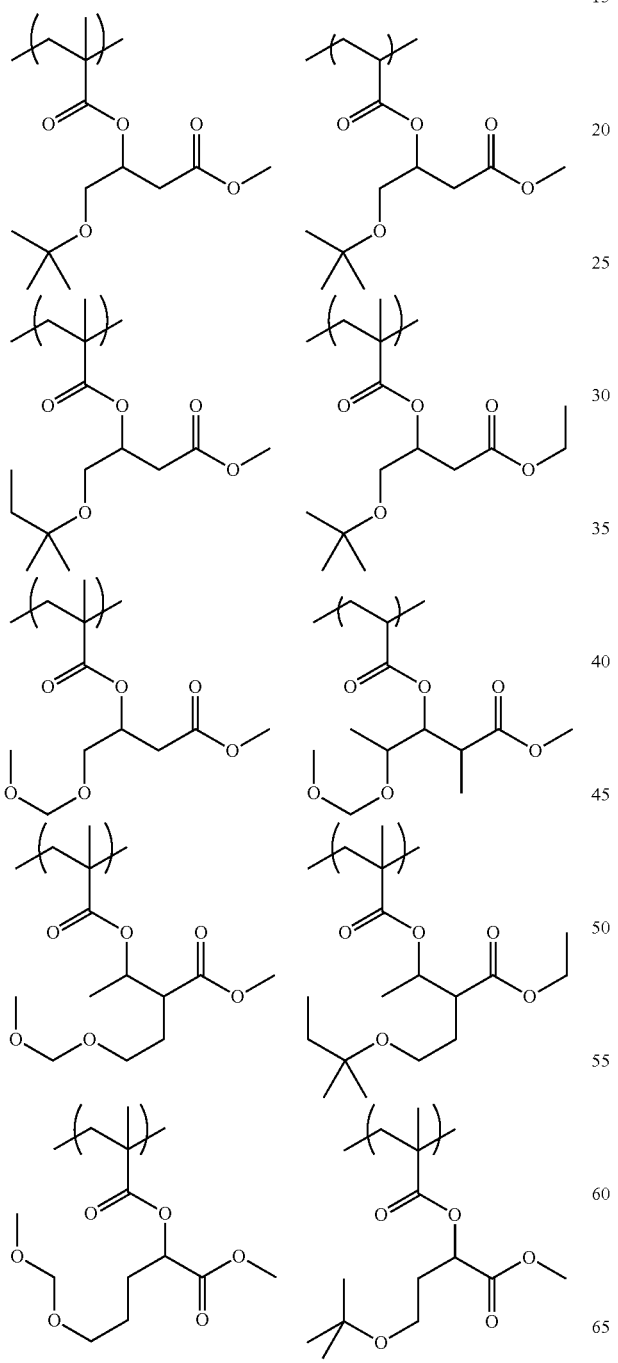
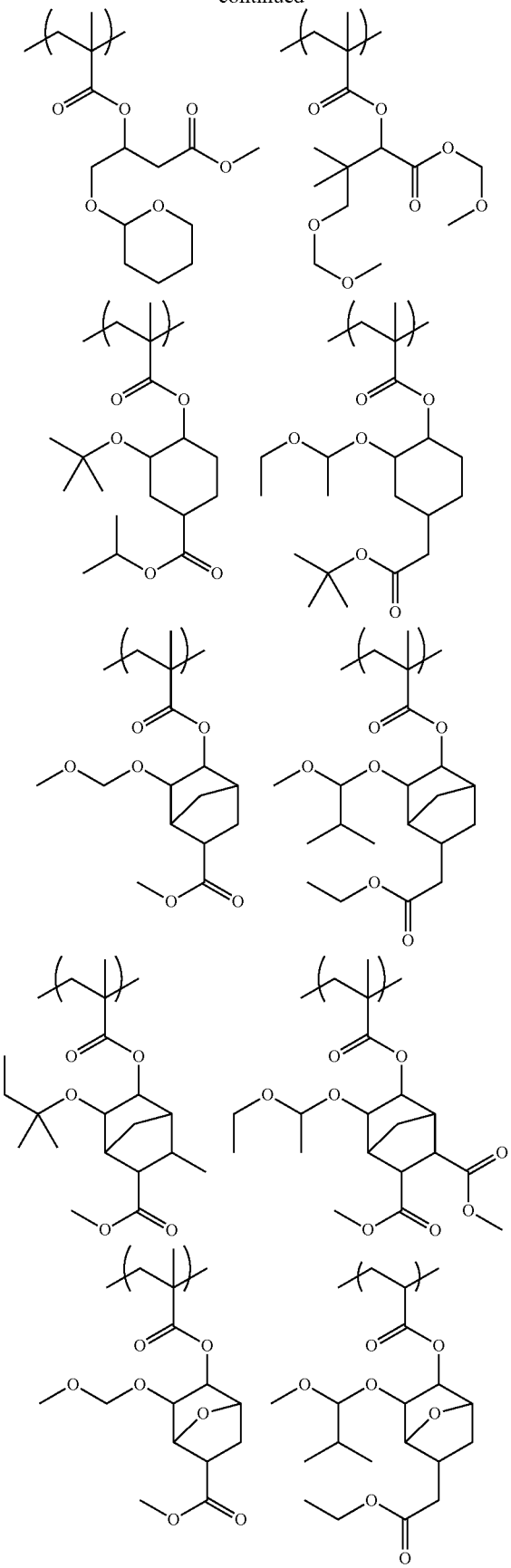

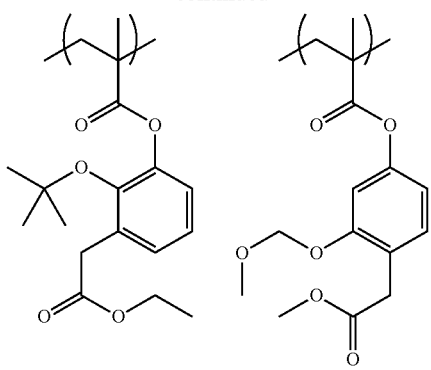
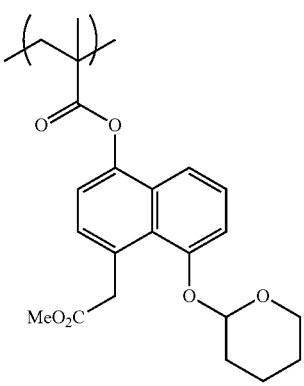
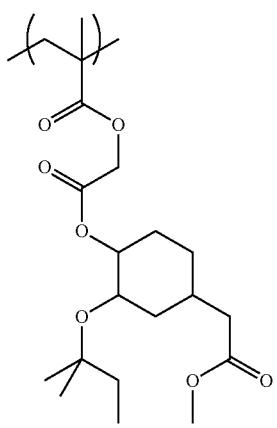
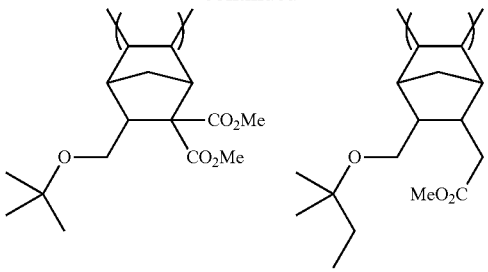
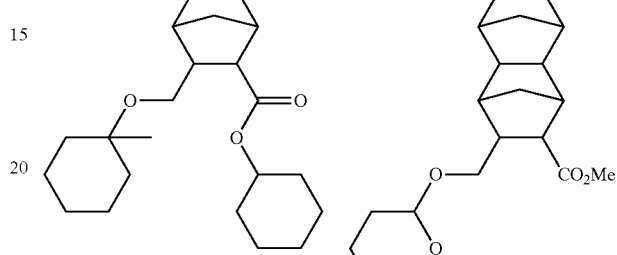
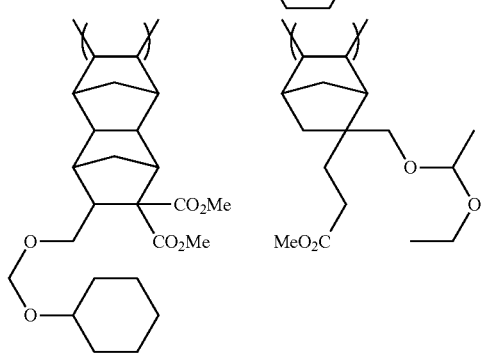
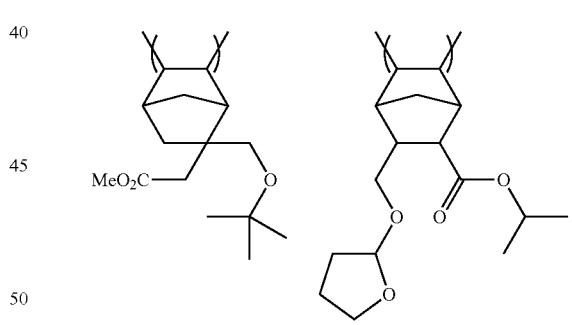
Examples of the recurring unit having formula (2) include the following structures, but are not limited thereto.
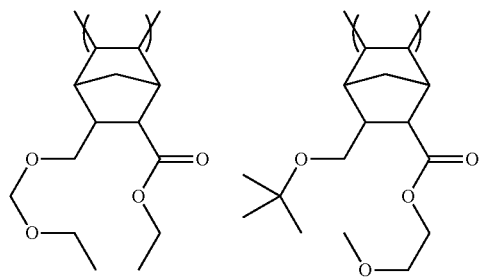
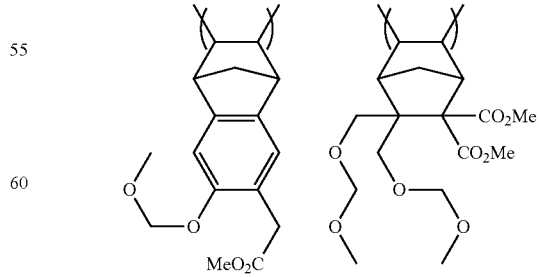
Examples of the recurring unit having formula (3) include the following structures, but are not limited thereto.

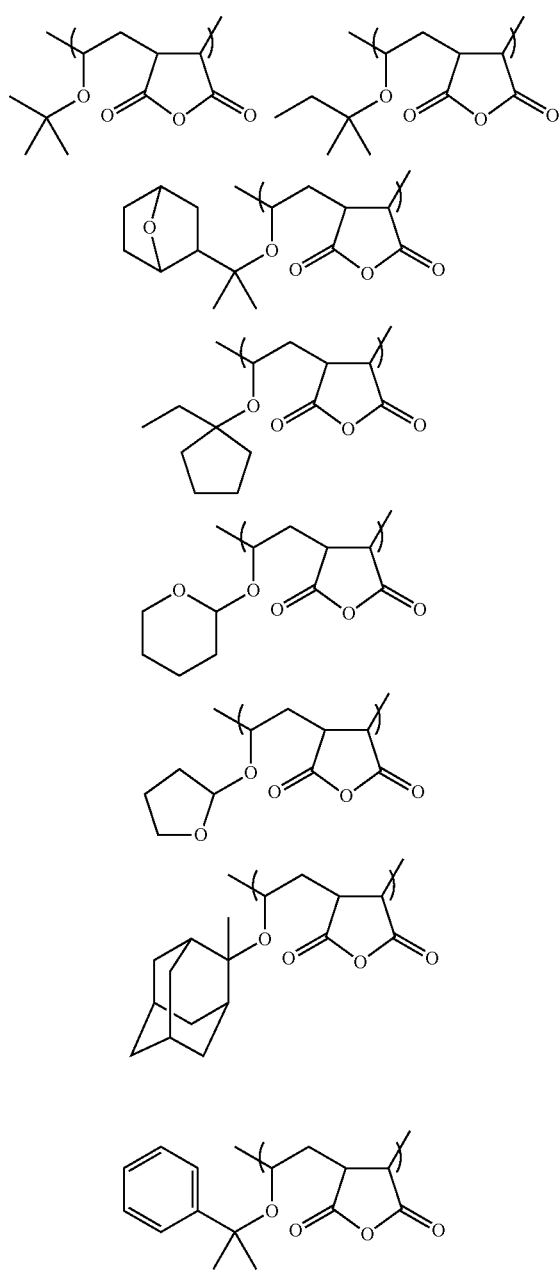

Besides the recurring units having formulae (1) to (3), the recurring units capable of forming a lactone ring under the action of an acid include, for example, recurring units having the general formula (4).

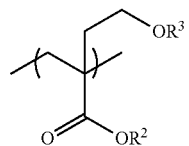
(4)

Herein $R^2$ and $R^3$ are as defined above.

Examples of the recurring unit having formula (4) include the following structures, but are not limited thereto.

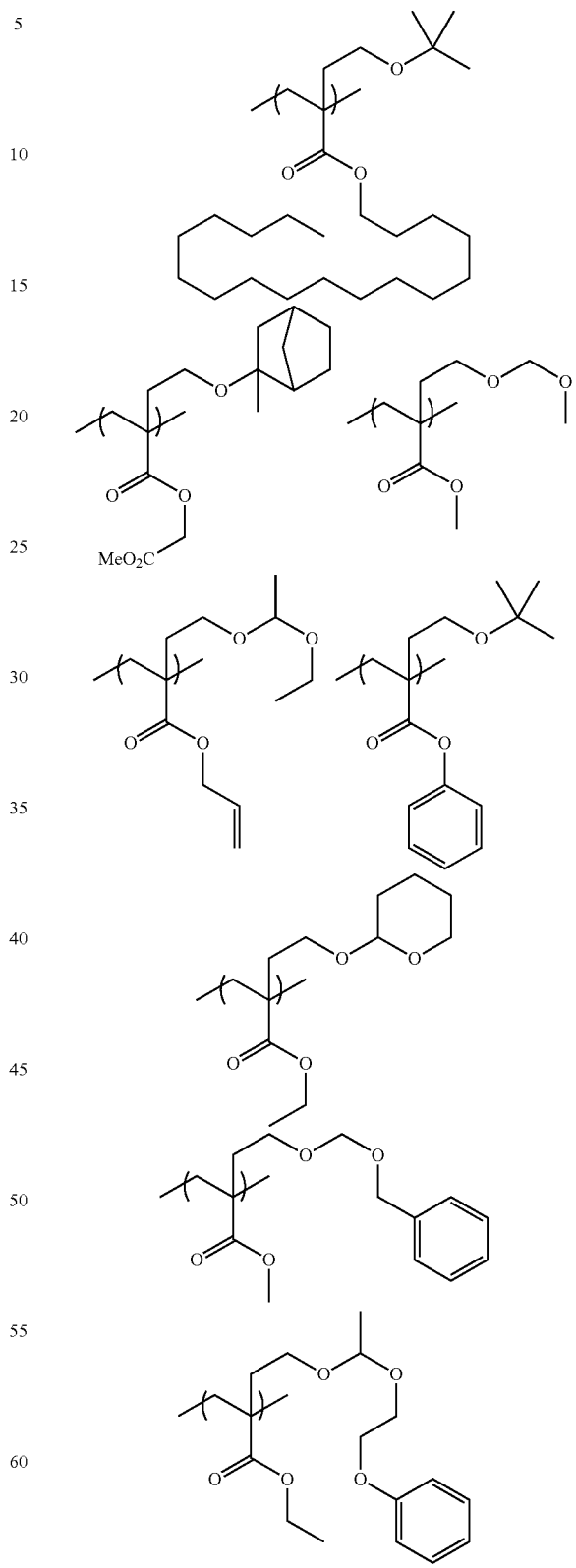

Of the recurring units having formulae (1) to (4), units of one type may be selected or units of two or more types may be incorporated in a common polymer. Combination of recurring units of different type makes it possible to tailor the performance of a resist composition to which the polymer is added. Preferably the recurring units having formulae (1) to (4) in total account for 5 to 100 mol %, more preferably 10 to 100 mol % of the entire recurring units of the polymer. Incorporation of less than 5 mol % of these units may exert less of their desired effect, failing to achieve a high contrast.

When the recurring units having formulae (1) to (4) in total account for less than 100 mol % of the entire recurring units of the polymer, the polymer contains other recurring units. Although the other recurring units are not particularly limited, for example, recurring units of at least one type selected from the general formulae (R1) to (R14) may be incorporated.

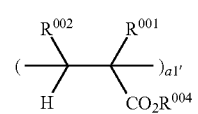
(R1)

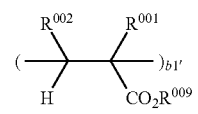
(R2)

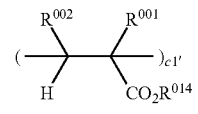
(R3)

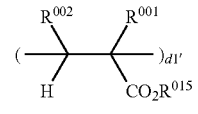
(R4)

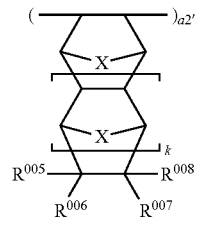
(R5)

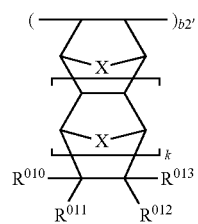
(R6)

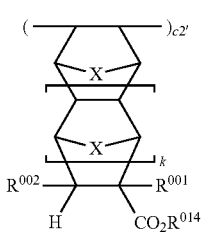
(R7)

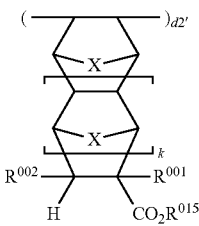
(R8)

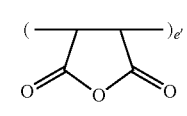
(R9)

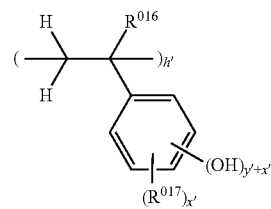
(R10)

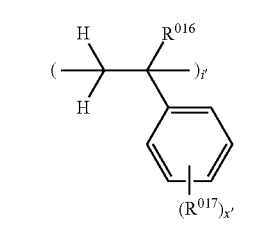
(R11)

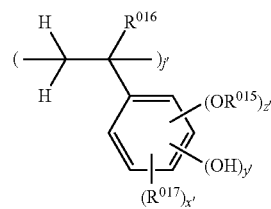
(R12)

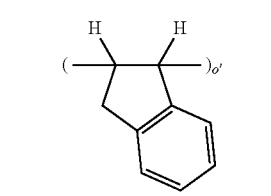
(R13)

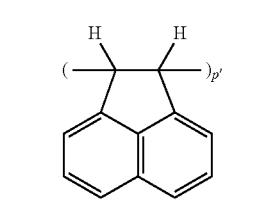
(R14)

Herein, $R^{001}$ is hydrogen, methyl or —$CH_2CO_2R^{003}$.

$R^{002}$ is hydrogen, methyl or —$CO_2R^{003}$.

$R^{003}$ is a straight, branched or cyclic $C_1$-$C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$-$C_{15}$ hydrocarbon group having at least one of fluorinated substituent groups, carboxyl, hydroxyl and cyano groups, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, di(hydroxyhexafluoroisopropyl)cyclohexyl, 2-hydroxyphenyl, 3-hydroxyphenyl, 4-hydroxyphenyl, dihydroxyphenyl, hydroxynaphthyl, and 2-cyanoethyl.

At least one of $R^{005}$ to $R^{008}$ represents a monovalent $C_1$-$C_{15}$ hydrocarbon group having at least one of fluorinated substituent groups, carboxyl, hydroxyl and cyano groups while the remaining R's independently represent hydrogen or straight, branched or cyclic $C_1$-$C_{15}$ alkyl groups. Examples of the monovalent $C_1$-$C_{15}$ hydrocarbon group having at least one of fluorinated substituent groups, carboxyl groups and hydroxyl groups include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, di(hydroxyhexafluoroisopropyl)cyclohexyloxycarbonyl, 2-hydroxyphenyl, 3-hydroxyphenyl, 4-hydroxyphenyl, dihydroxyphenyl, and hydroxynaphthyl. Examples of the straight, branched or cyclic $C_1$-$C_{15}$ alkyl group are the same as exemplified for $R^{003}$.

Alternatively, two of $R^{005}$ to $R^{008}$ may bond together to form a ring. In that event, at least one of ring-forming $R^{005}$ to $R^{008}$ is a divalent $C_1$-$C_{15}$ hydrocarbon group having at least one of fluorinated substituent groups, carboxyl groups and hydroxyl groups, while the remaining is a single bond or a straight, branched or cyclic $C_1$-$C_{15}$ alkylene group. Examples of the divalent $C_1$-$C_{15}$ hydrocarbon group having at least one of fluorinated substituent groups, carboxyl groups and hydroxyl groups include the groups exemplified as the monovalent hydrocarbon group having at least one of fluorinated substituent groups, carboxyl groups and hydroxyl groups, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{009}$ is a monovalent $C_3$-$C_{15}$ hydrocarbon group containing a —$CO_2$— partial structure, preferably having a lactone structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_2$-$C_{15}$ hydrocarbon group containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

Alternatively, two of $R^{010}$ to $R^{013}$ may bond together to form a ring. In that event, at least one of ring-forming $R^{010}$ to $R^{013}$ is a divalent $C_1$-$C_{15}$ hydrocarbon group containing a —$CO_2$— partial structure, while the remaining is a single bond or a straight, branched or cyclic $C_1$-$C_{15}$ alkylene group.

Examples of the divalent $C_1$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic $C_7$-$C_{15}$ hydrocarbon group or an alkyl group containing a polycyclic hydrocarbon group, for example, norbornyl, bicyclo[3.3.1]nonyl, tricyclo[5.2.1.0$^{2,6}$]decyl, adamantyl, ethyladamantyl, butyladamantyl, norbornylmethyl, and adamantylmethyl.

$R^{015}$ is an acid labile group or an organic group containing an acid labile ether group, which will be described later.

X is —$CH_2$ or an oxygen atom.

$R^{016}$ is hydrogen or methyl. $R^{017}$ is a straight, branched or cyclic $C_1$-$C_8$ alkyl group.

The subscripts a1', b1', c1', d1', a2', b2', c2', d2', e', h', i', j', o', and p' each are a number from 0 to less than 1; k is 0 or 1; x', y' and z' each are an integer of 0 to 3, satisfying $1 \leq x'+y'+z' \leq 5$ and $1 \leq y'+z' \leq 3$.

The acid labile group represented by $R^{015}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

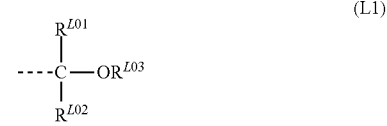

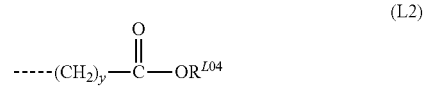

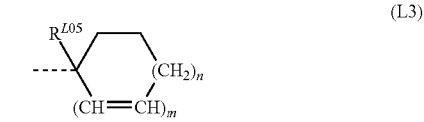

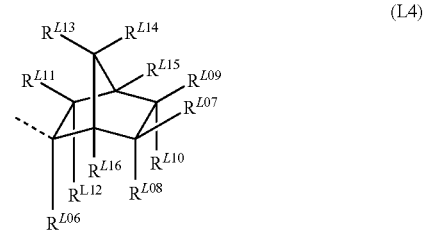

In these formulae, the broken line denotes a valence bond. In formula (L1), $R^{L01}$ and $R^{L02}$ each are hydrogen or a straight, branched or cyclic alkyl group of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$, and suitable substituted alkyl groups are shown below.

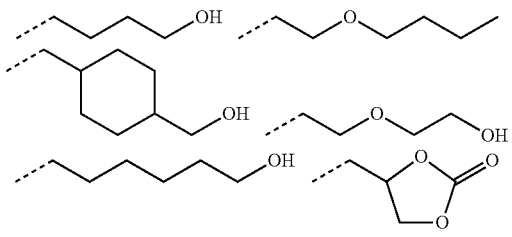

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxoxan-4-yl, and 5-methyl-2-oxooxolan-5-yl. Letter y is an integer of 0 to 6.

In formula (L3), $R^{L05}$ is a substituted or unsubstituted, straight, branched or cyclic $C_1$-$C_{10}$ alkyl group or a substituted or unsubstituted $C_6$-$C_{20}$ aryl group. Examples of the optionally substituted alkyl group include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, substituted forms of such groups in which some hydrogen atoms are substituted by hydroxyl, alkoxy, carboxyl, alkoxycarbonyl, oxo, amino, alkylamino, cyano, mercapto, alkylthio, sulfo or other groups, and similar groups in which one or more methylene moiety is replaced by oxygen or sulfur atom. Examples of the optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is a substituted or unsubstituted, straight, branched or cyclic $C_1$-$C_{10}$ alkyl group or a substituted or unsubstituted $C_6$-$C_{20}$ aryl group. Examples of these groups are the same as exemplified for $R^{L05}$. $R^{L07}$ to $R^{L16}$ independently represent hydrogen or monovalent $C_1$-$C_{15}$ hydrocarbon groups. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$, taken together, form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair). Each of $R^{L07}$ to $R^{L16}$ represents a divalent $C_1$-$C_{15}$ hydrocarbon group when they form a ring, examples of which are the ones exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

$R^{015}$ may also be an organic group containing an acid labile ether radical. This organic group may be selected from a variety of such groups. Inter alia, it is preferably a monovalent $C_1$-$C_{15}$ organic group having a hydroxyl group protected with an acid labile group of the general formulae (L1) to (L4) defined above.

Of the recurring units having formulae (R1) to (R14), units of one type may be selected or units of two or more types may be incorporated in a common polymer. Combination of recurring units of different type makes it possible to tailor the performance of a resist composition to which the polymer is added. In addition to the recurring units having formulae (1) to (4) and formulae (R1) to (R14), the polymer used herein may further comprise any of recurring units which are well known to be incorporated in base resins for conventional chemically amplified resist compositions, for example, photoacid generating units and basic units.

Recurring units of at least one type selected from formula (R1), when incorporated into a polymer, make it possible to tailor such properties as acid diffusion length and contact angle. Illustrative, non-limiting examples of the recurring units having formula (R1) are given below.

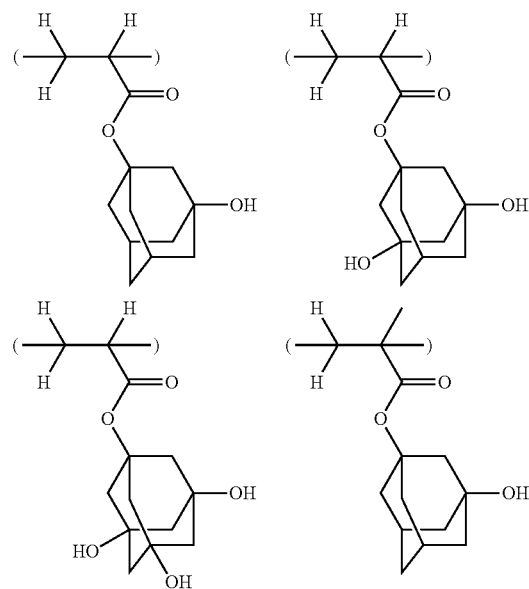

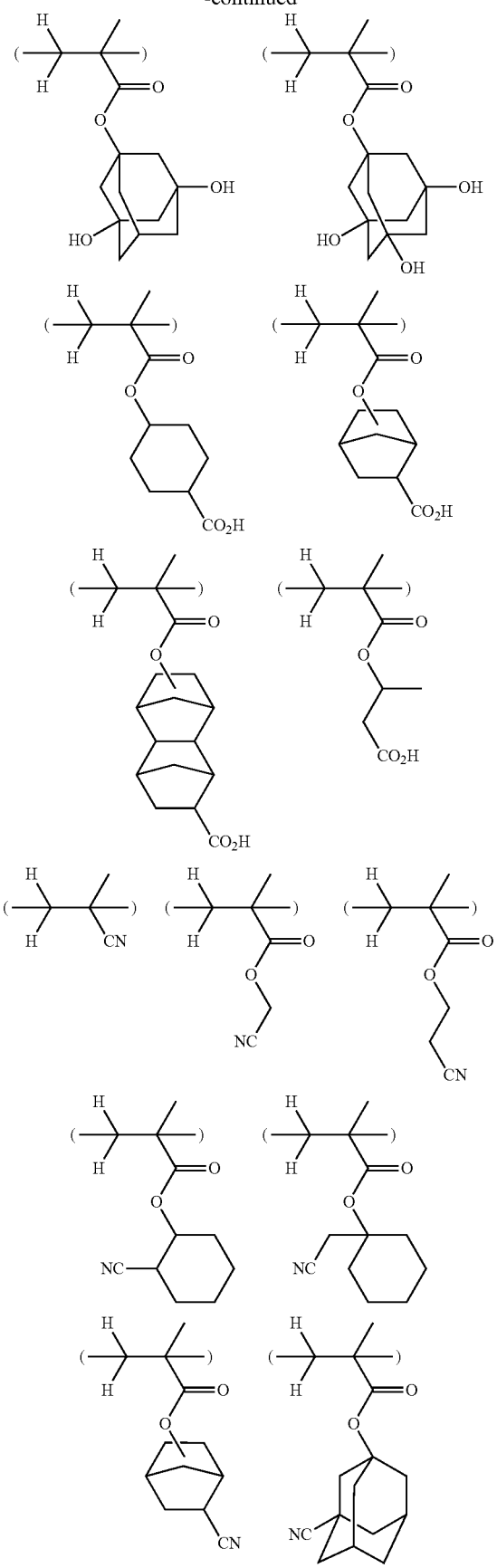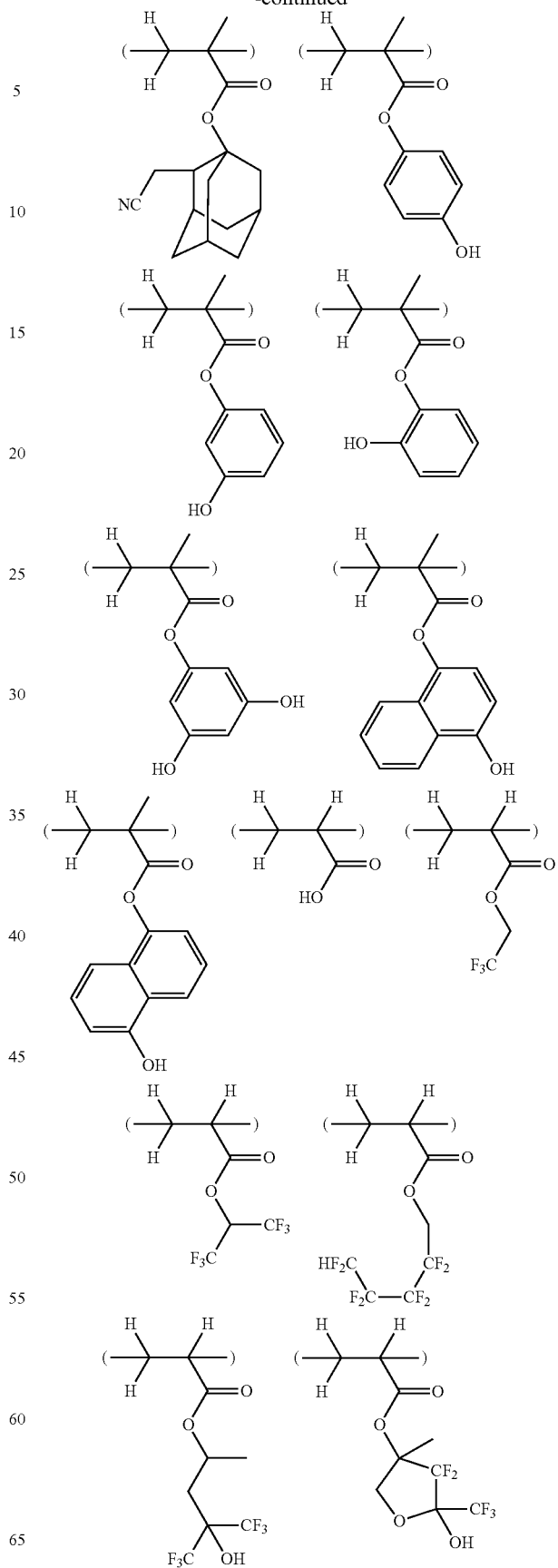

-continued
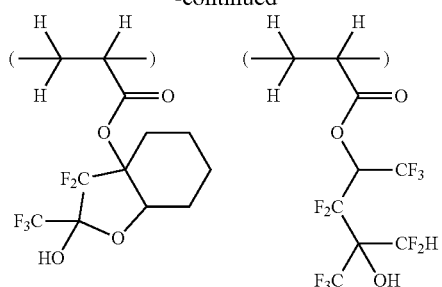
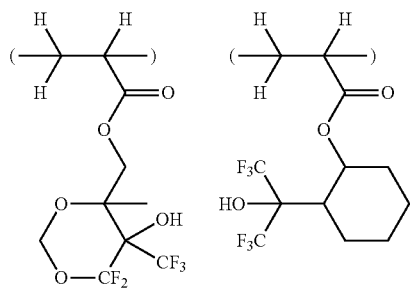
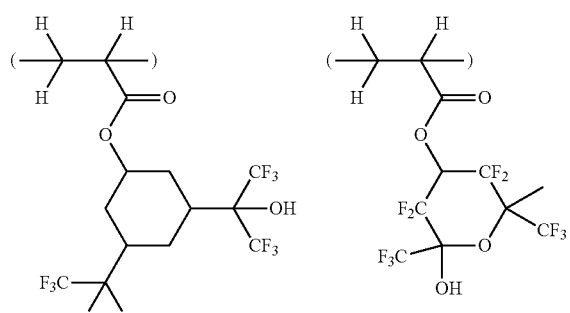
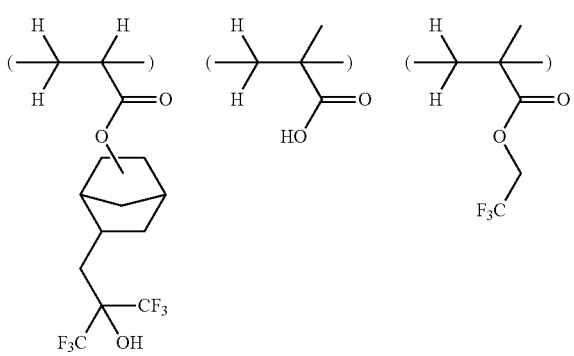
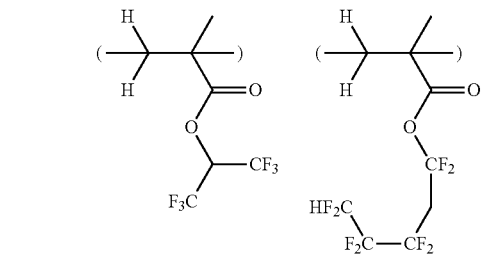
-continued
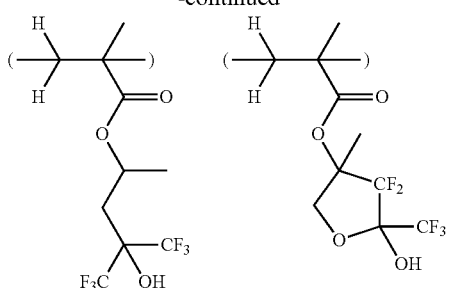
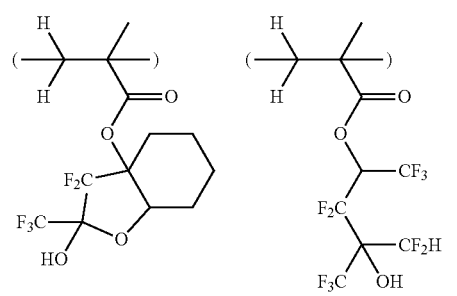
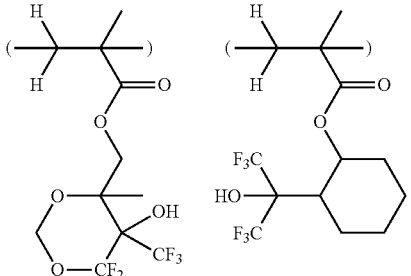
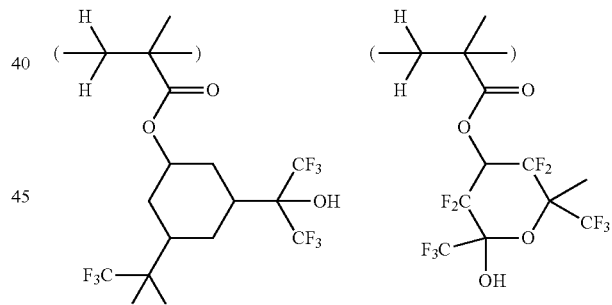
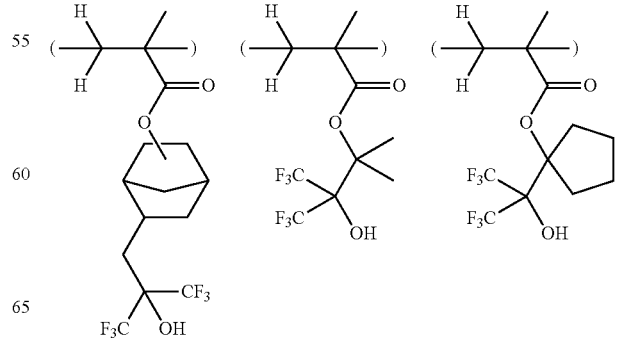

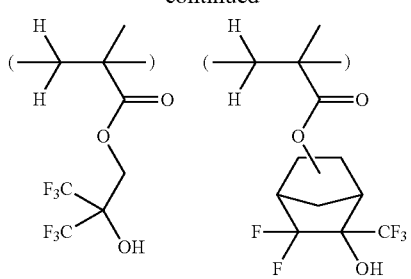
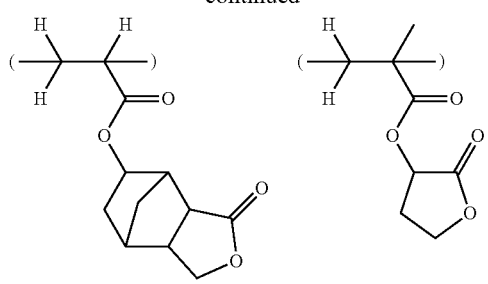
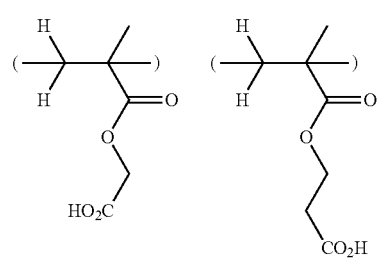
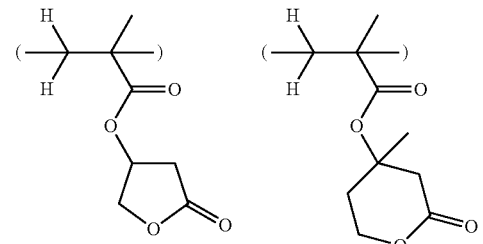
Recurring units of at least one type selected from formula (R2), when incorporated into a polymer, make it possible to improve the adhesion of resist pattern to substrate. Illustrative, non-limiting examples of the recurring units having formula (R2) are given below.
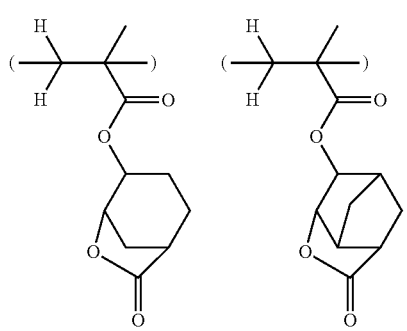
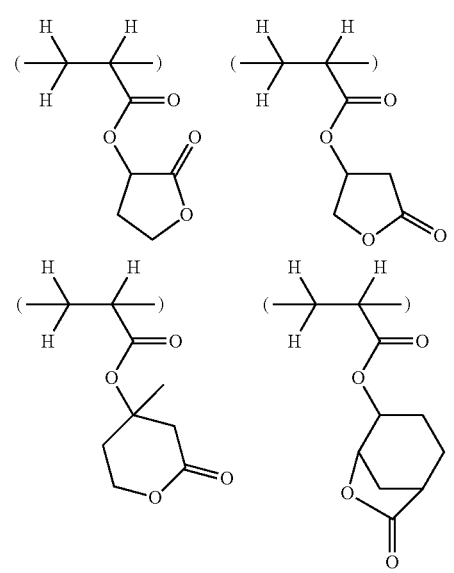
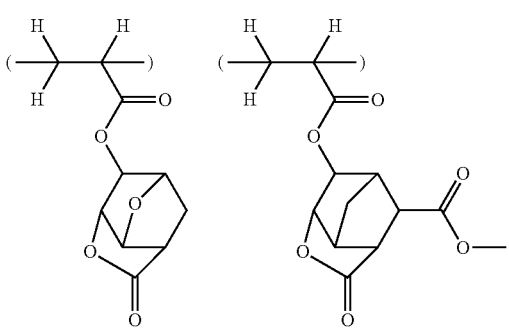

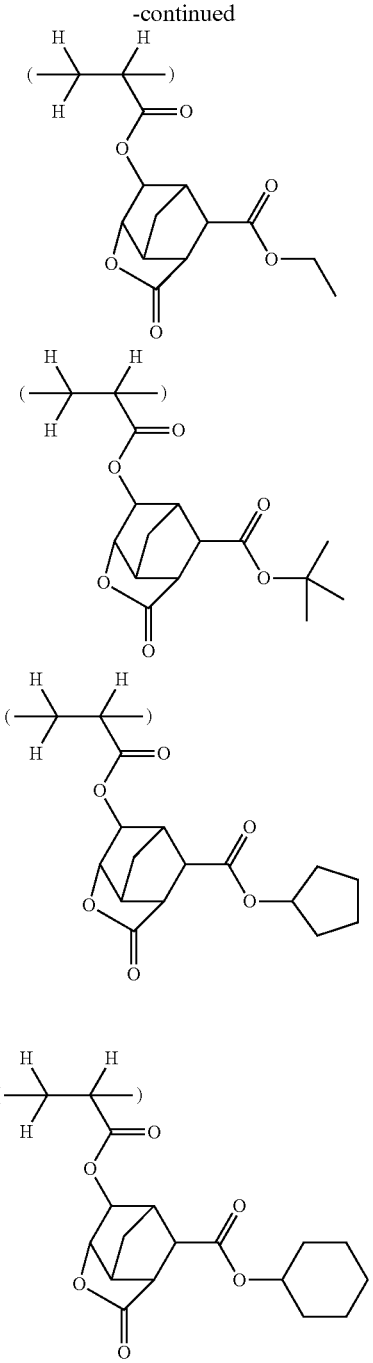
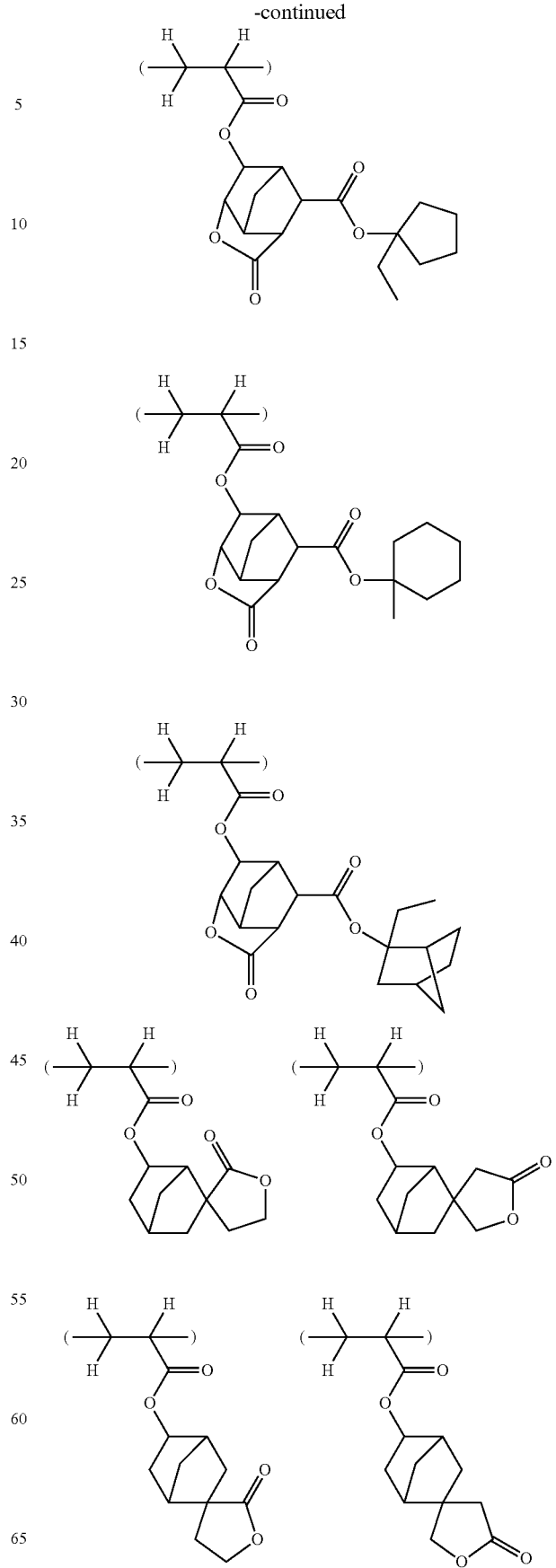

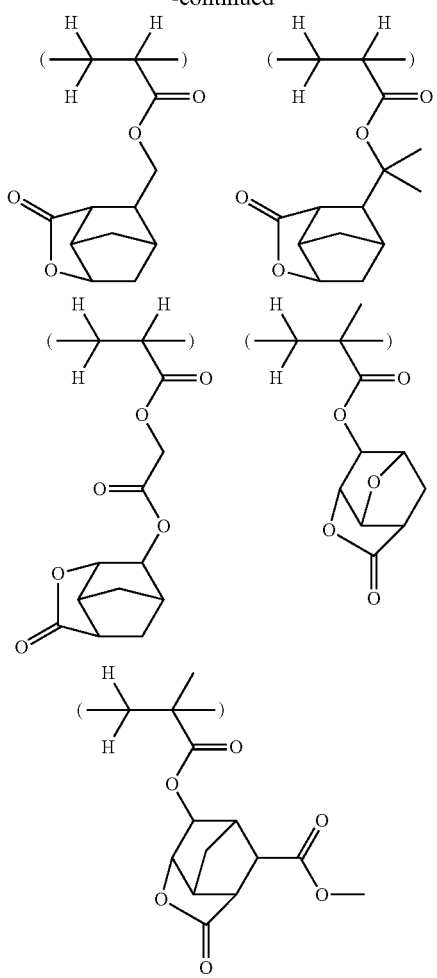
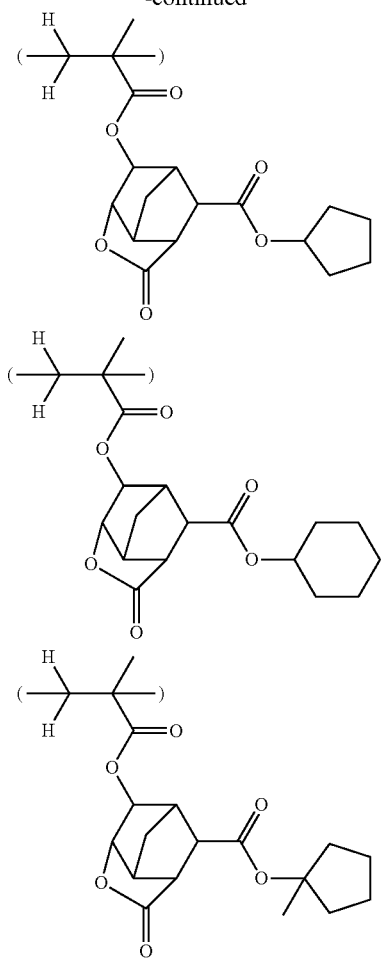
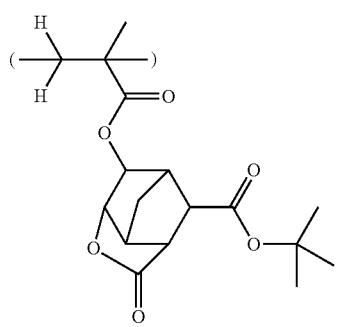

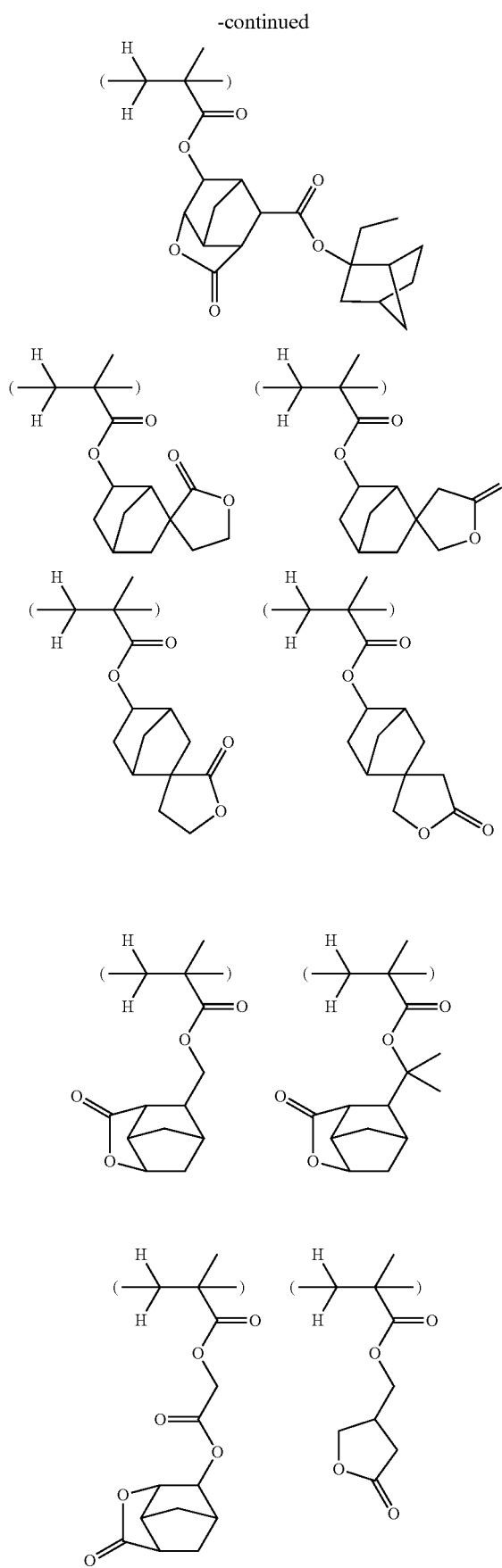
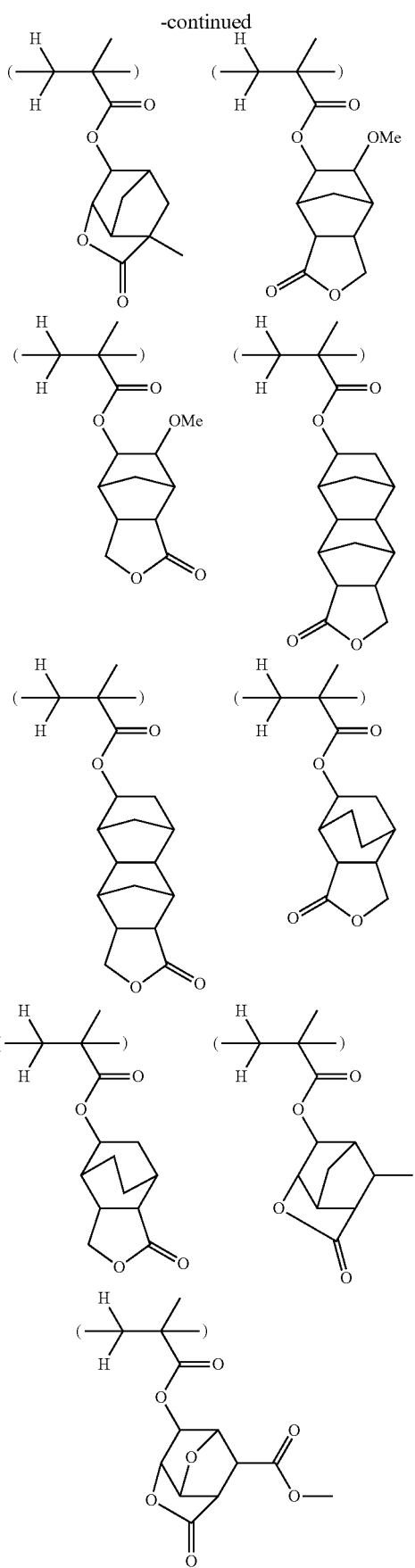

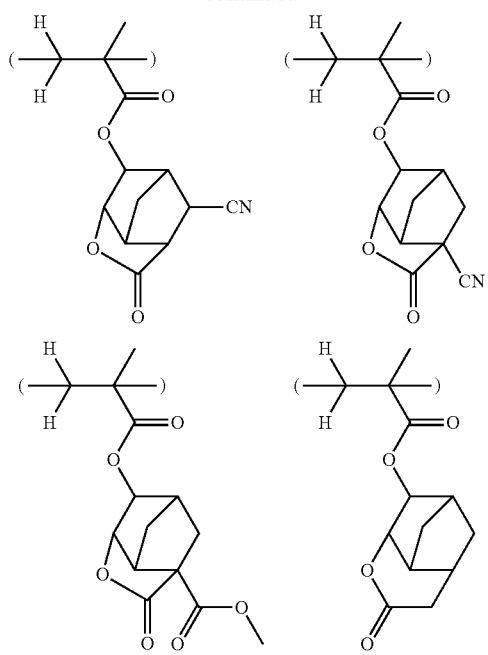
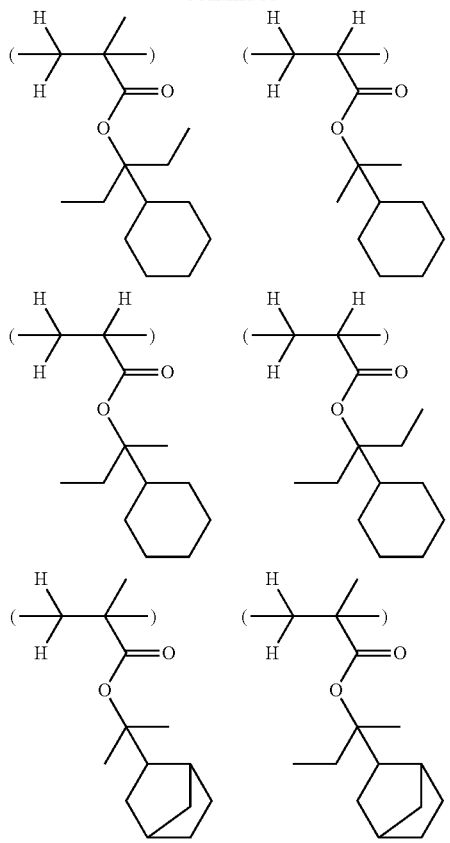
Recurring units of at least one type selected from formula (R4), when incorporated into a polymer, make it possible to tailor such properties as dissolution contrast. Illustrative, non-limiting examples of the recurring units having formula (R4) are given below.
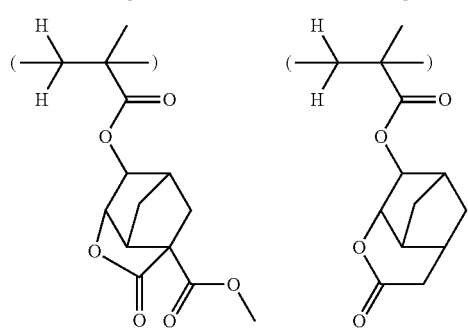
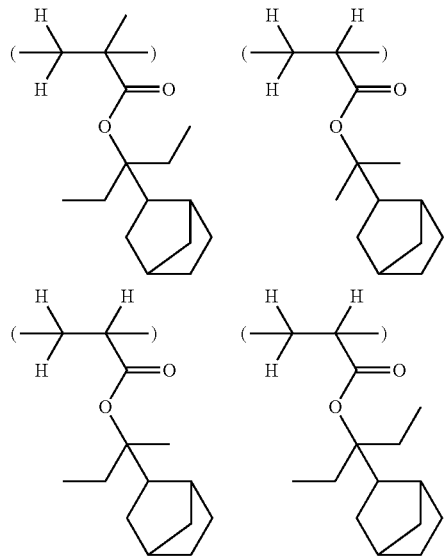
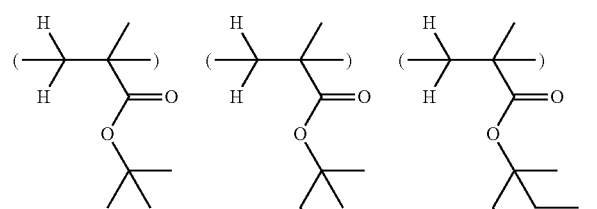
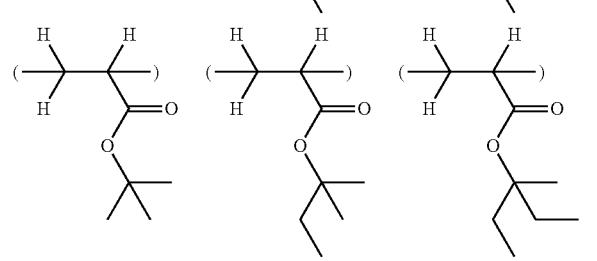
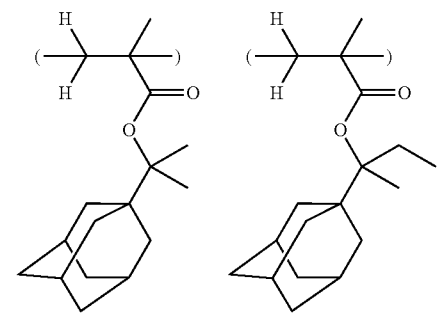
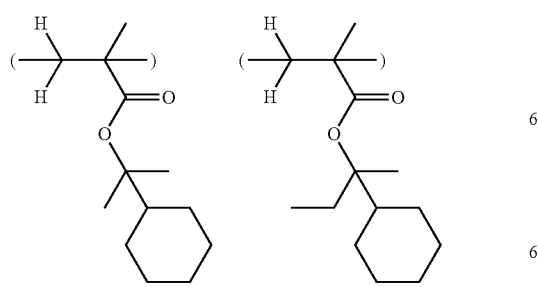

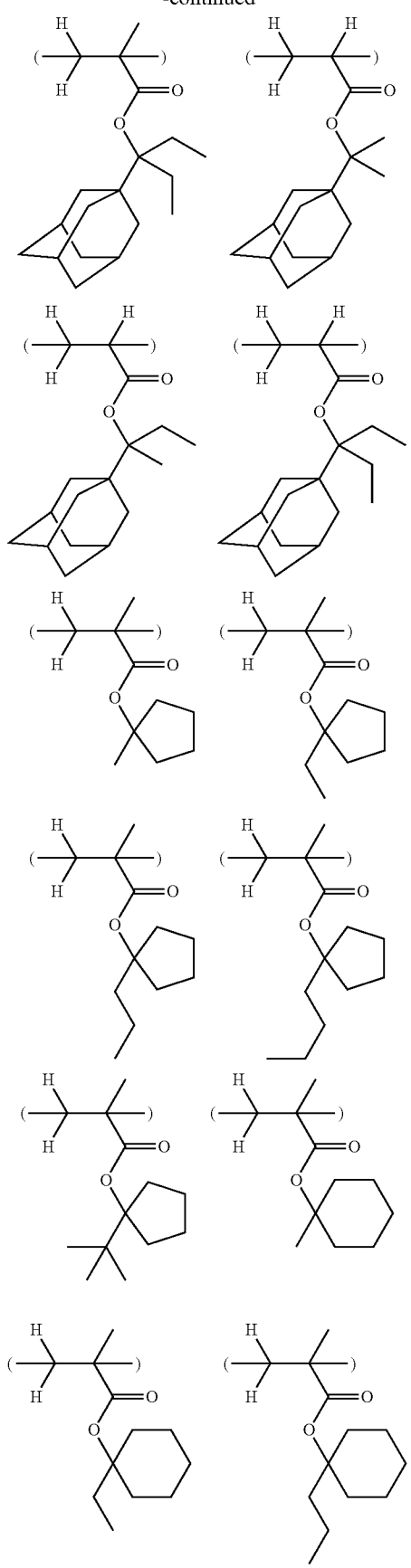
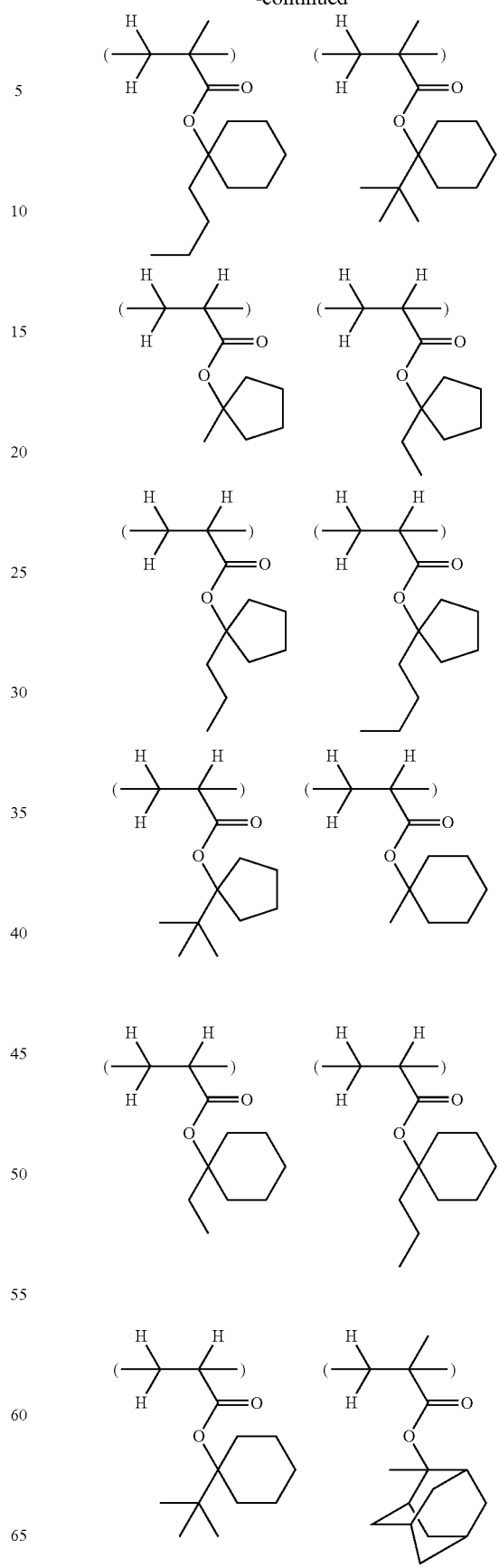

-continued
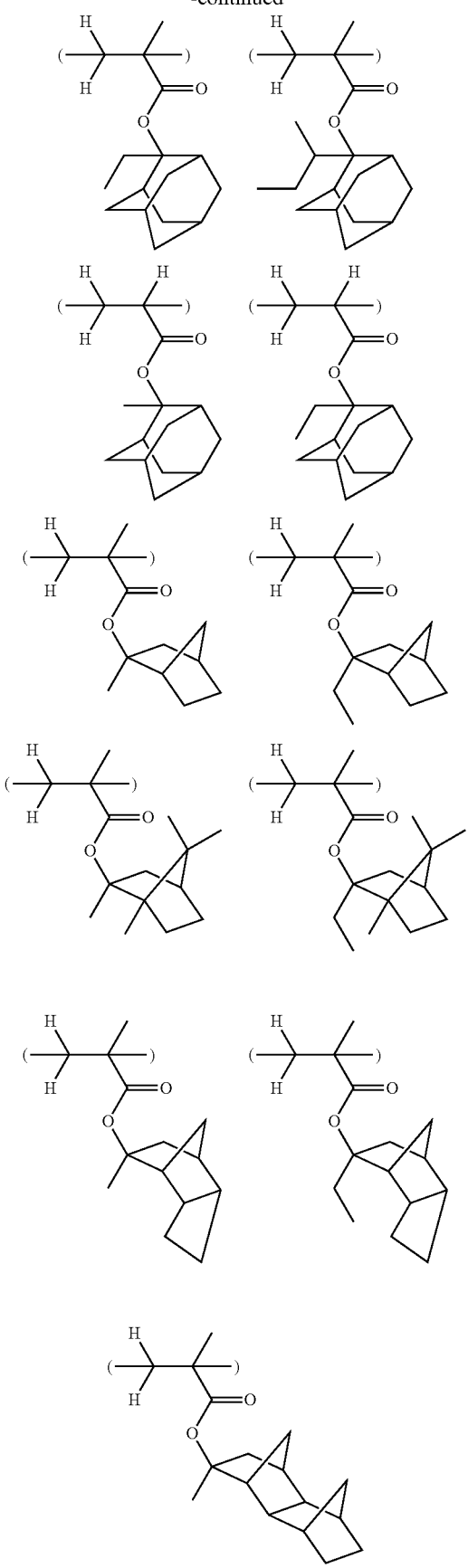
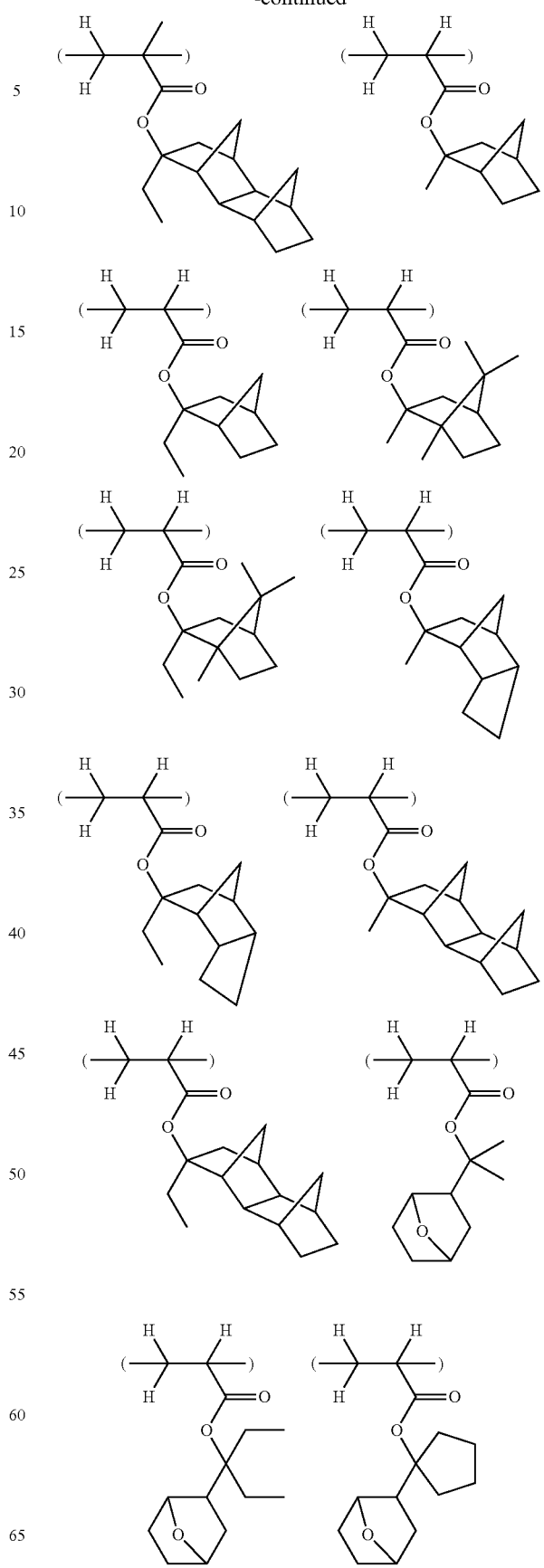

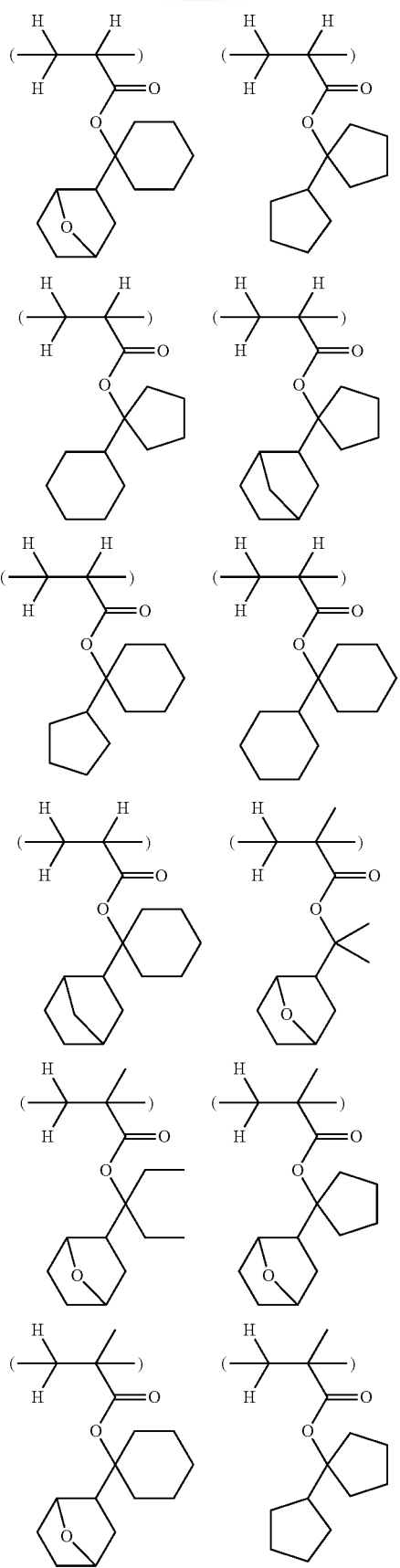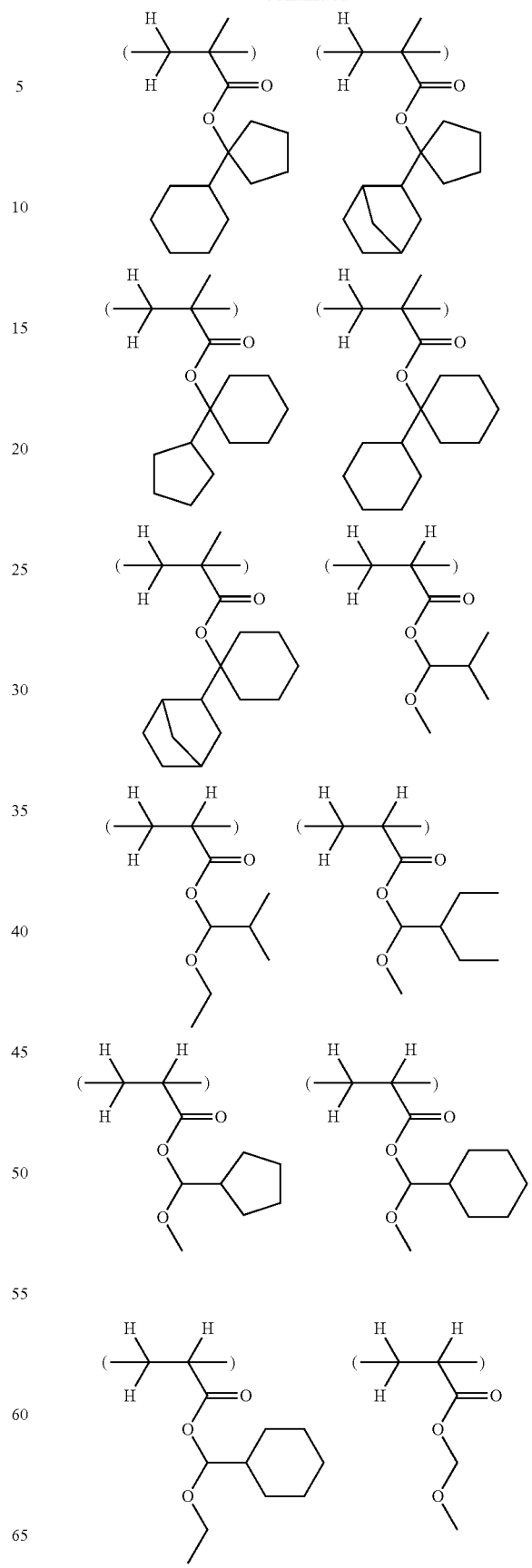

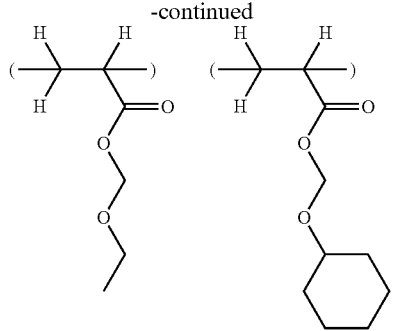
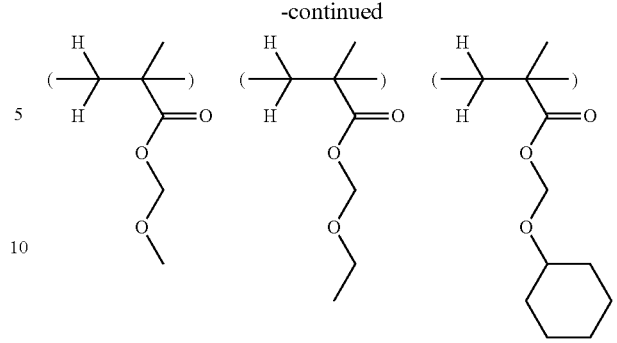
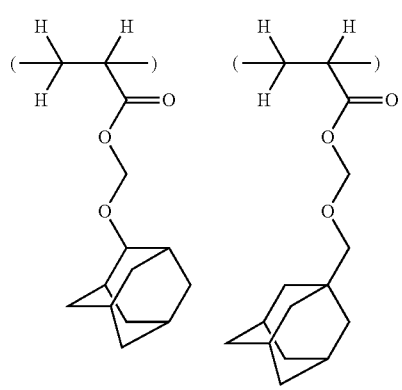
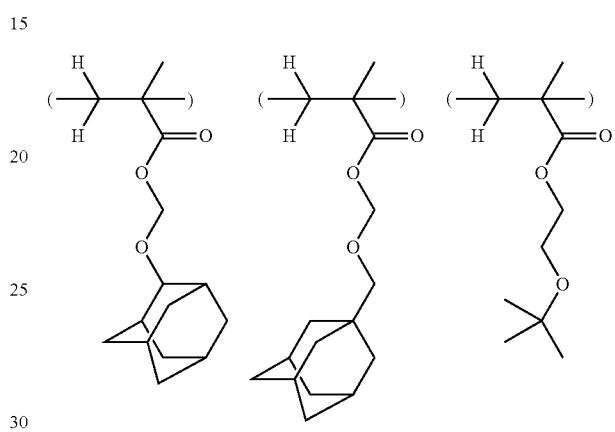
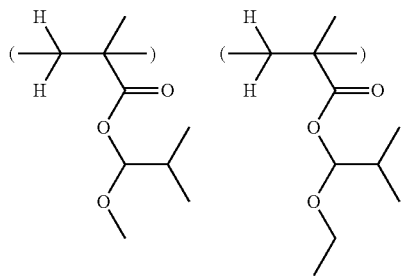
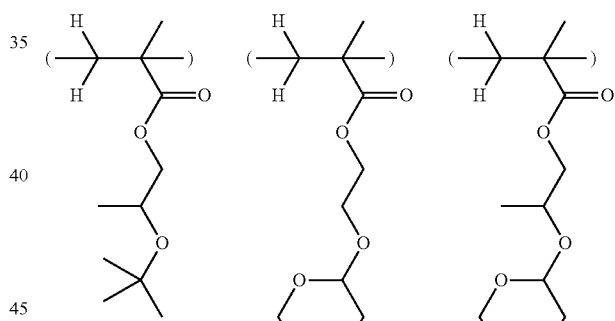
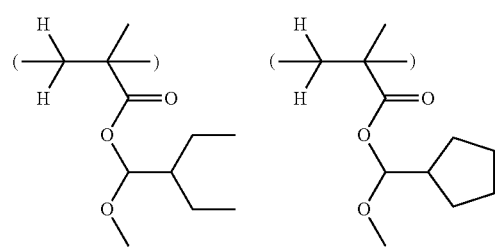
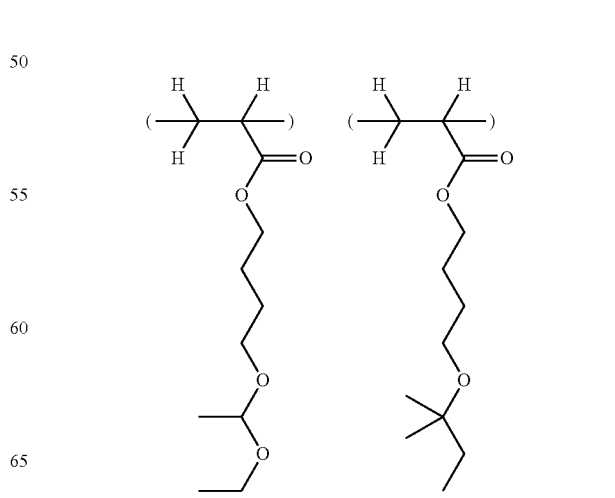
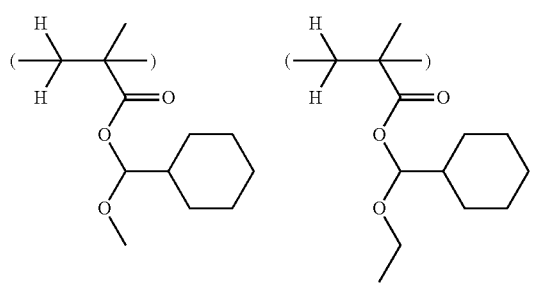

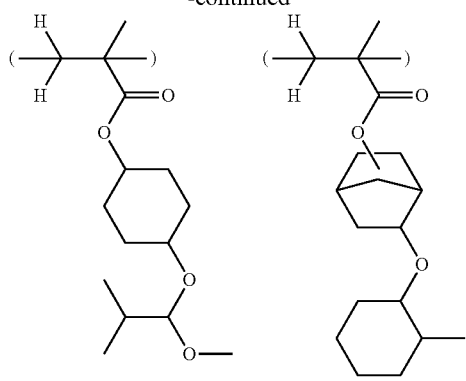
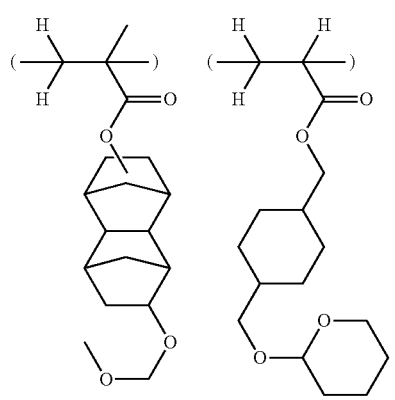
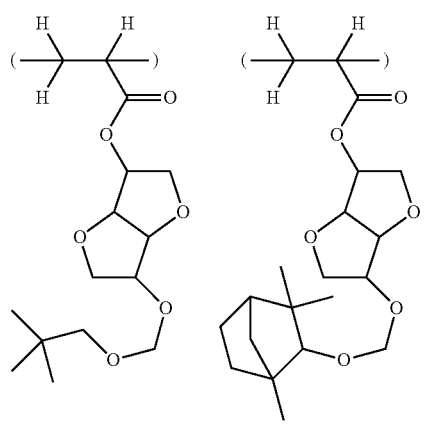
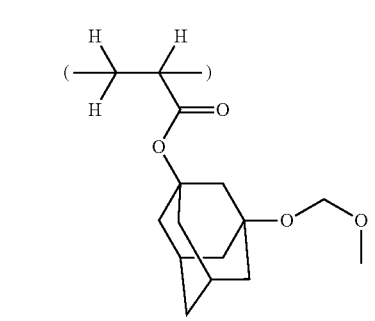
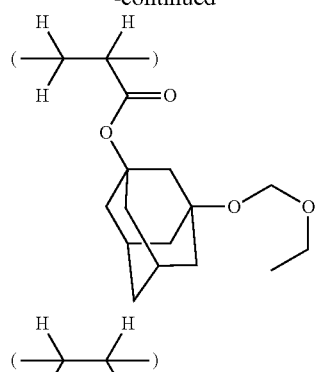
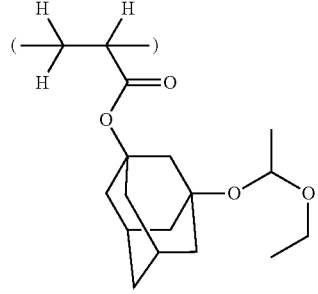
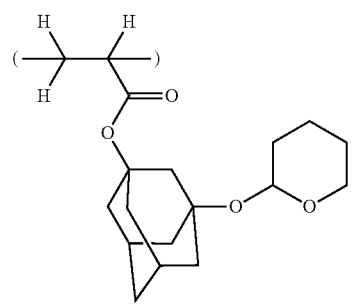
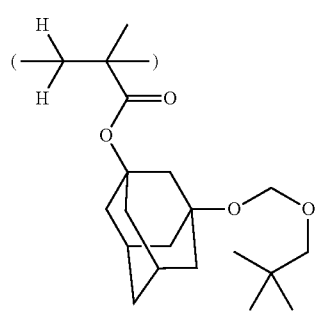
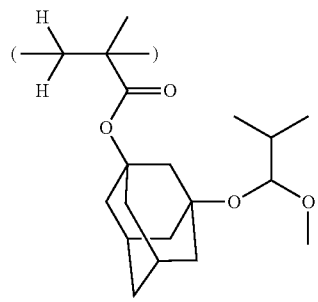

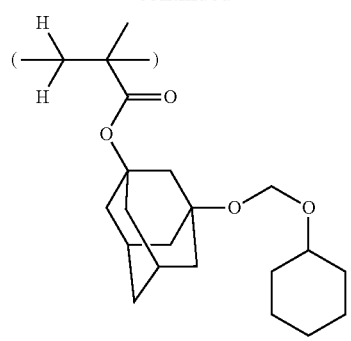
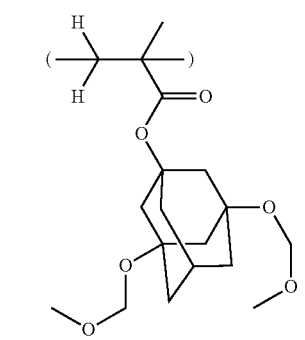
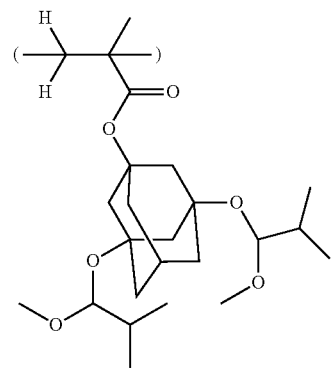
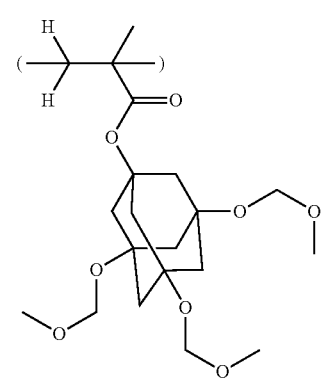
Illustrative, non-limiting examples of the polymers of the invention are given below.
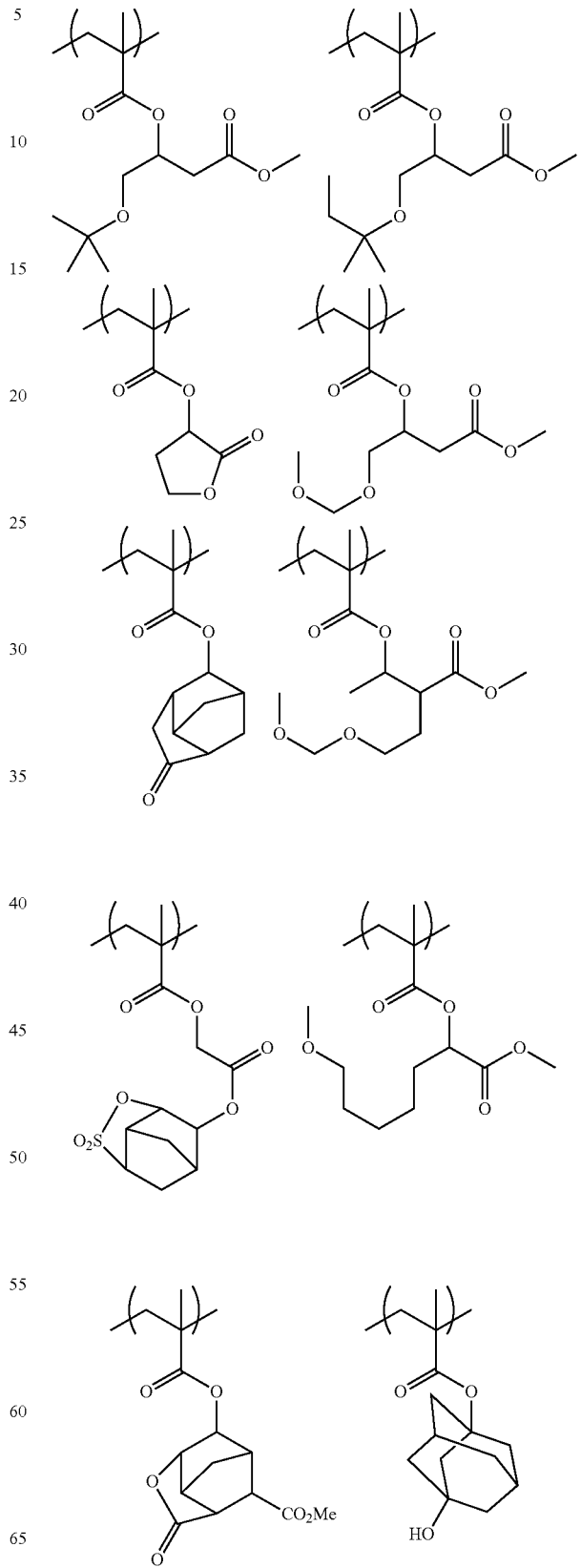

-continued
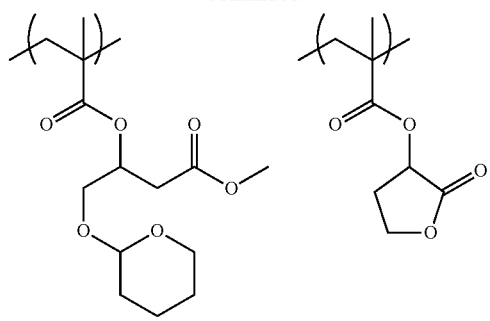
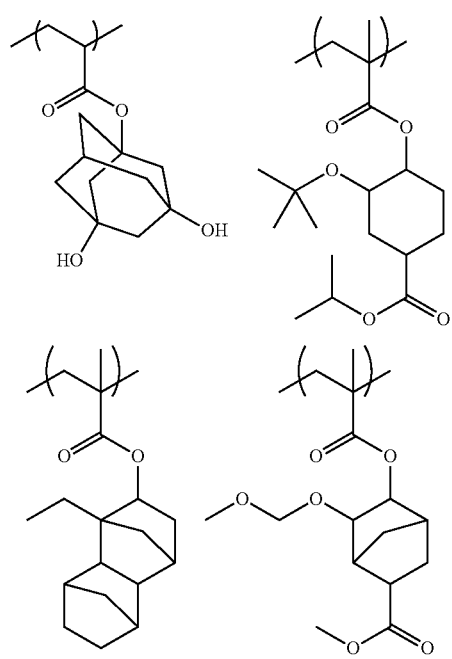
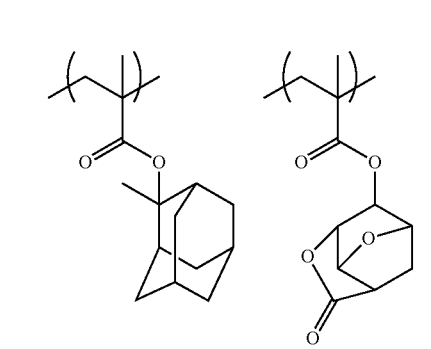
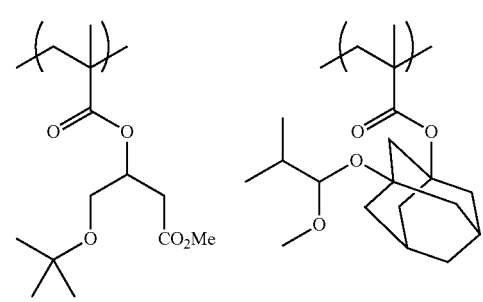
-continued
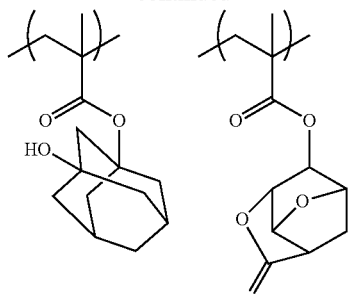
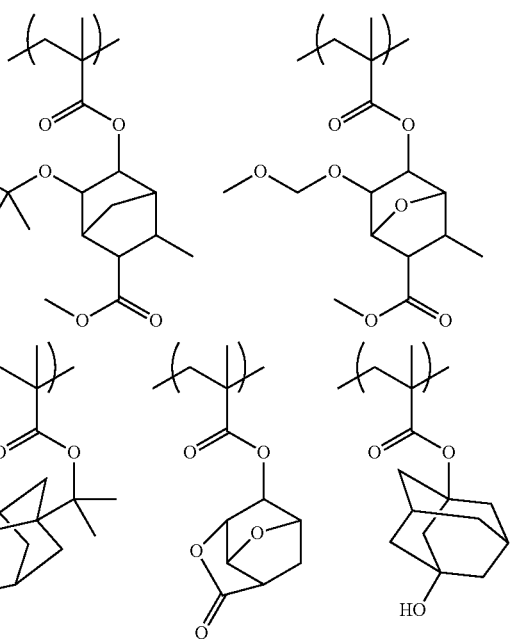
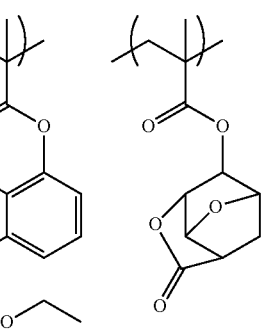
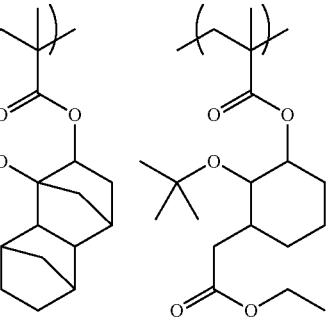

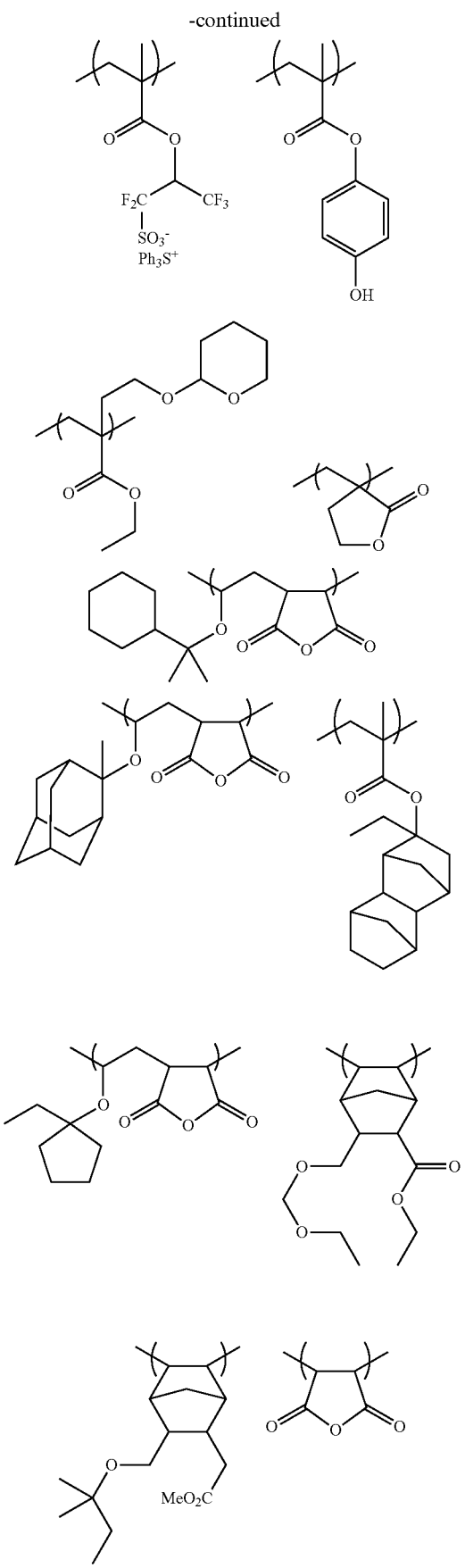
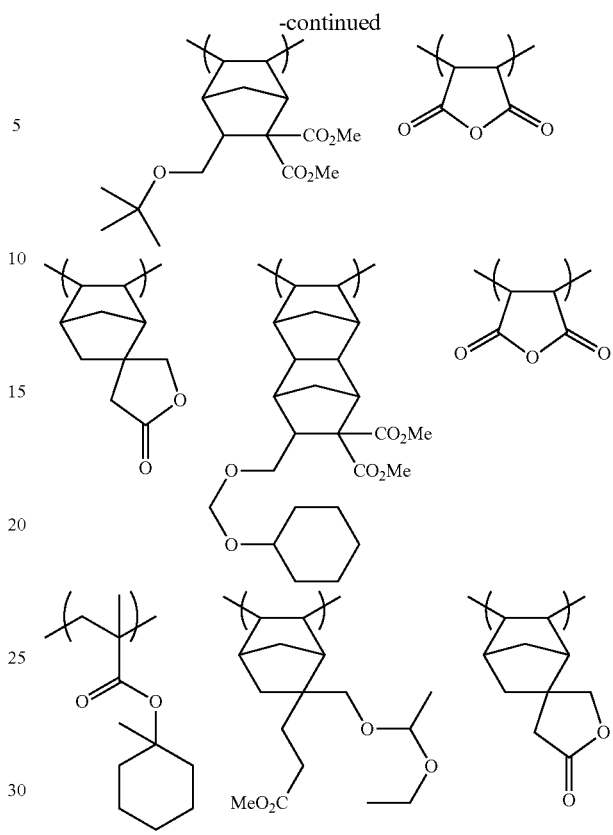

The polymer serving as the base resin in the resist composition used in the pattern forming process of the invention should preferably have a weight average molecular weight (Mw) in the range of 1,000 to 100,000, and more preferably 2,000 to 50,000, as measured by GPC versus polystyrene standards using tetrahydrofuran solvent. With too low a Mw, a film thickness loss is likely to occur upon organic solvent development. A polymer with too high a Mw may lose solubility in organic solvent and have a likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, in order to provide a resist composition suitable for micropatterning to a small feature size. It is acceptable to use a blend of two or more polymers which differ in compositional ratio, molecular weight or dispersity, as the base resin.

The polymer used herein may be synthesized by any desired method, for example, by dissolving unsaturated bond-containing monomers corresponding to the respective units in an organic solvent, adding a radical initiator thereto, and effecting heat polymerization. Polymerization conditions are not particularly limited and may be selected in accordance with particular monomers used, the desired molecular weight and the like. Examples of the organic solvent which can be used for polymerization include toluene, benzene, tetrahydrofuran, diethyl ether, dioxane, 2-butanone, PGMEA, cyclohexanone, γ-butyrolactone, and butyl acetate. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Also a chain transfer agent may be added to the polymerization system, for example, thiols such as octanethiol and 2-mercaptoethanol. Preferably the system is heated at 40 to the boiling point of the reaction medium for polymerization to take place. The reaction time is 0.5 to 100 hours, preferably 1 to 48 hours. The acid labile group that has been incorporated in the monomers may be kept as such, or the polymerization may be followed by protection or partial protection.

For instance, a polymer comprising recurring units of formula (1) or (2) may be synthesized by using an ester compound having a polymerizable double bond as represented by the general formula (1a) or (2a) as the monomer, and effecting polymerization as above.

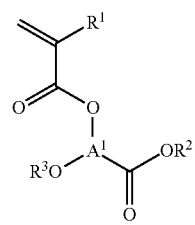

(1a)

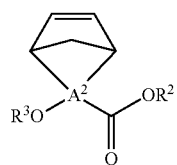

(2a)

Herein $R^1$, $R^2$, $R^3$, $A^1$ and $A^2$ are as defined above.

Examples of the polymerizable ester compound having formula (1a) are given below, but not limited thereto.

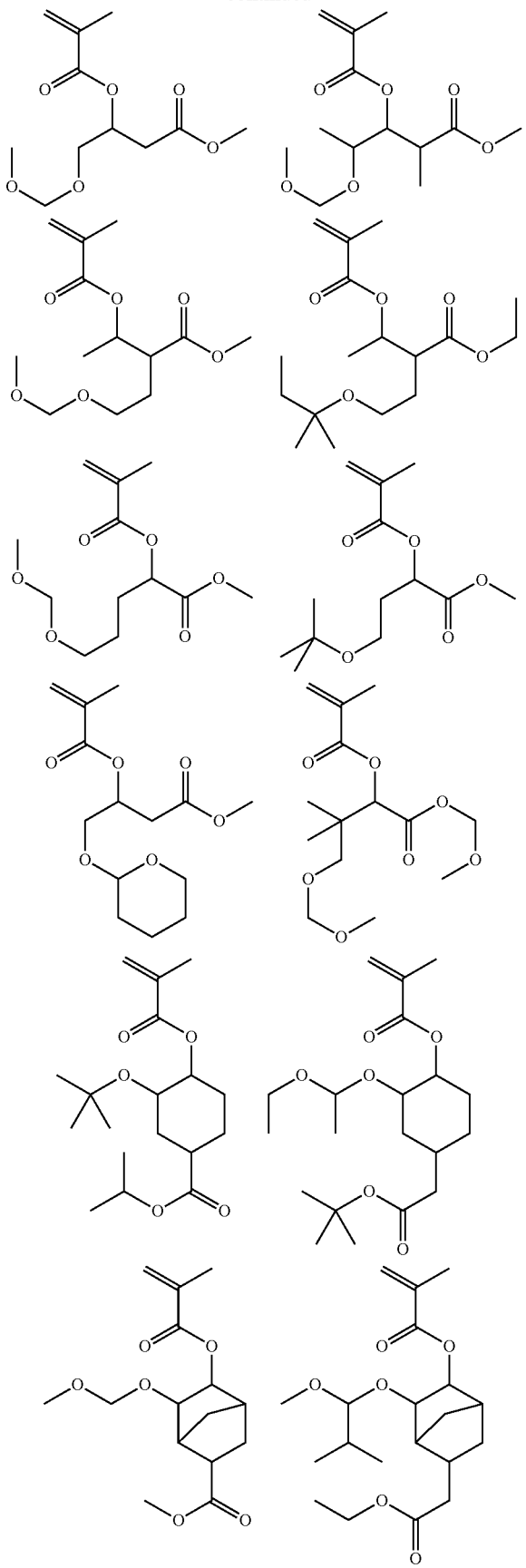

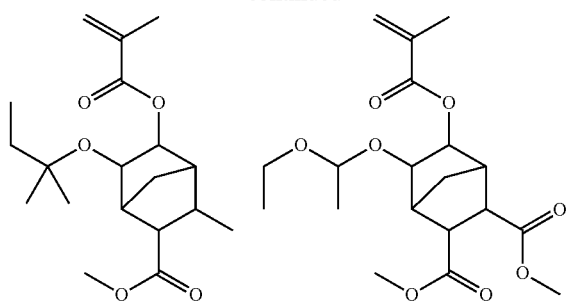
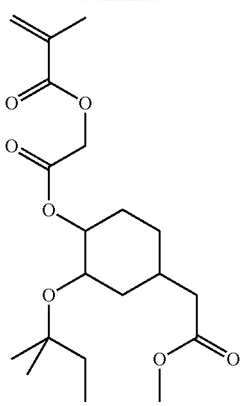
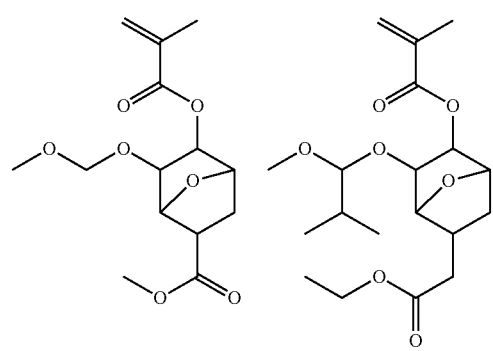
Examples of the polymerizable ester compound having formula (2a) are given below, but not limited thereto.
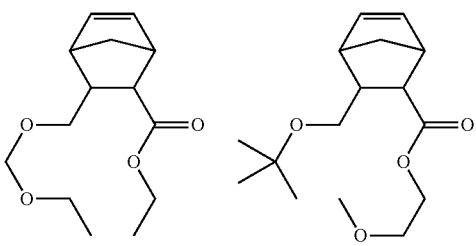
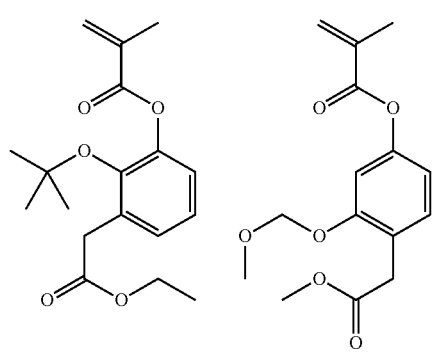
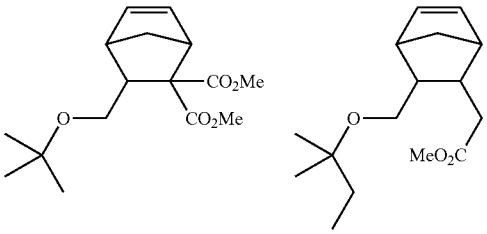
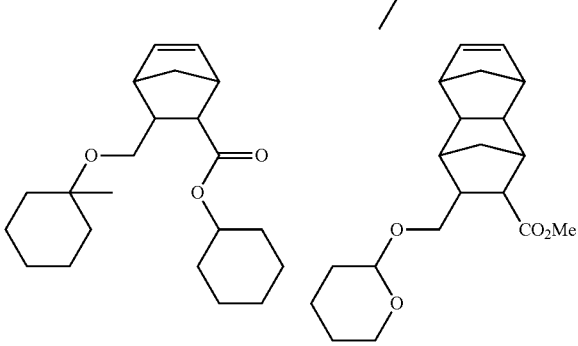
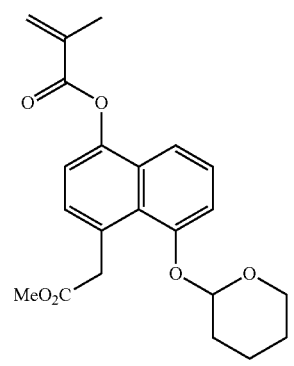
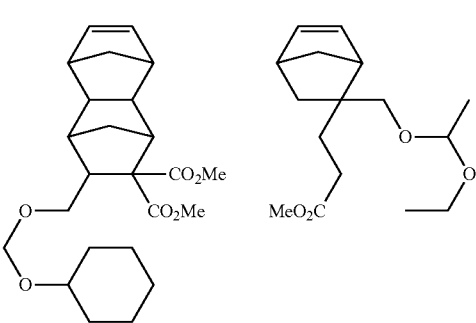

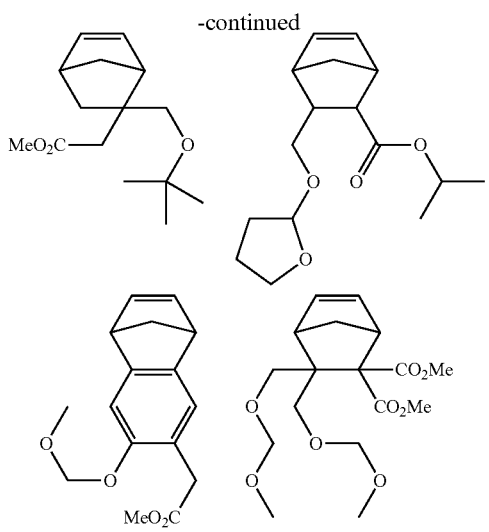

The synthesis of the polymerizable ester compound having formula (1a) or (2a) is not particularly limited. It may be synthesized by the optimum method selected depending on its structure, for example, as shown by the following schemes.

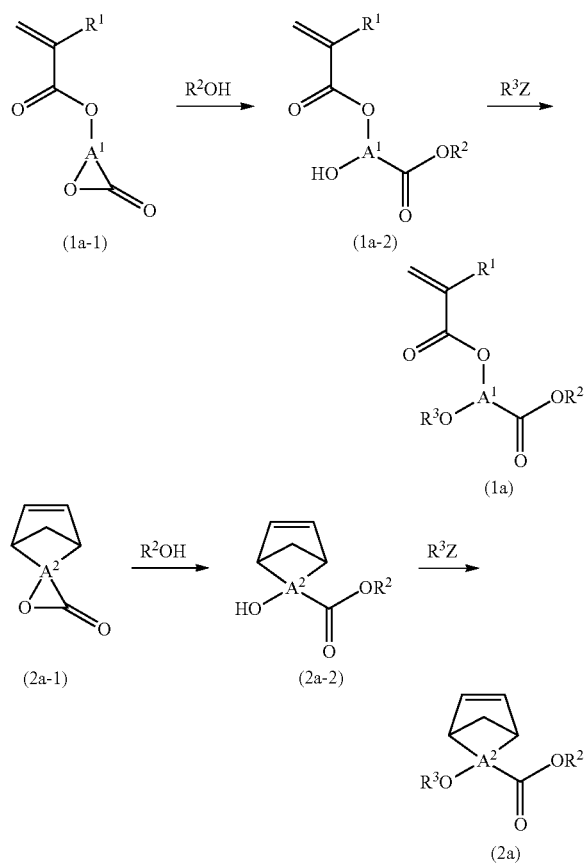

Herein $R^1$, $R^2$, $R^3$, $A^1$ and $A^2$ are as defined above, and Z is a leaving group such as halogen.

The starting reactant is a lactone compound (1a-1) or (2a-1). As the lactone compound (1a-1) or (2a-1), a number of compounds are known as the adhesive monomer for resist use. Examples of lactone compound (1a-1) include monomers corresponding to the illustrated examples of the recurring units of formula (R2). The first step is synthesis of hydroxy ester compound (1a-2) or (2a-2) through lactone ring-opening reaction using alcohol $R^2OH$. This reaction is generally performed in the presence of a basic catalyst such as potassium carbonate, sodium methoxide, or potassium t-butoxide. The second step is etherifying reaction of the alcohol using $R^3Z$, yielding the desired polymerizable ester compound (1a) or (2a). This reaction is generally performed in the presence of an organic base such as pyridine or triethylamine. If necessary, the compound (1a) or (2a) thus obtained is purified by any of standard techniques such as water washing, distillation, recrystallization or chromatography, selected depending on the desired physical properties, before it is ready for polymerization.

The resist composition used in the pattern forming process of the invention comprises a base resin comprising the polymer defined above, an organic solvent, a compound capable of generating an acid in response to high-energy radiation (known as "acid generator"), and optionally, a basic compound, surfactant, dissolution regulator, acetylene alcohol, dye, antioxidant, and other well-known components.

In a further embodiment, the base resin may be a blend of the inventive polymer comprising recurring units having formulae (1) to (4) and a polymer of the conventional type wherein the exposed region is dissolved on alkaline development such as (meth)acrylate polymer, polynorbornene, cycloolefin-maleic anhydride alternating copolymer, or ring-opening metathesis polymerization (ROMP) polymer. Also, the inventive polymer may be blended with a (meth)acrylate polymer having an acid labile group-substituted hydroxyl group wherein the exposed region is not dissolved by alkaline development, but a negative pattern is formed by organic solvent development.

The resist composition used herein may include an acid generator in order for the composition to function as a chemically amplified resist composition. Typical of the acid generator used herein is a photoacid generator (PAG) capable of generating an acid in response to actinic light or radiation. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. Any of the PAGs described in JP-A 2008-111103, paragraphs [0122] to [0142] (U.S. Pat. No. 7,537,880) may be used. The PAGs may be used alone or in admixture of two or more. In the embodiment wherein a polymer having acid generator units copolymerized therein is used as the base resin, the acid generator need not be separately added.

It is noted that an acid diffusion controlling function may be provided when two or more acid generators are used in admixture provided that one acid generator is an onium salt capable of generating a weak acid. Specifically, in a system using a mixture of a photoacid generator capable of generating a strong acid (e.g., fluorinated sulfonic acid) and an onium salt capable of generating a weak acid (e.g., non-fluorinated sulfonic acid or carboxylic acid), if the strong acid generated from the photoacid generator upon exposure to high-energy radiation collides with the unreacted onium salt having a weak acid anion, then a salt exchange occurs whereby the weak acid is released and an onium salt having a strong acid anion is formed. In this course, the strong acid is exchanged into the weak acid having a low catalysis, incurring apparent deactivation of the acid for enabling to control acid diffusion. If an onium salt capable of generating a strong acid is used, an exchange from the strong acid generated upon exposure to high-energy radiation to a weak acid as above can take place, but it never happens that the weak acid generated upon exposure to high-energy radiation collides with the unreacted onium salt capable of generating a strong acid to induce a salt exchange. This is because of a likelihood of an onium cation forming an ion pair with a stronger acid anion.

In the resist composition, the PAG may be added in any desired amount as long as the objects of the invention are not compromised. The PAG is preferably added in an amount of 0.1 to 80 parts and more preferably 1 to 40 parts by weight per 100 parts by weight of the base resin. Too high a proportion of the PAG may give rise to problems of degraded resolution and foreign matter upon development and resist film peeling.

The organic solvent used herein may be any organic solvent in which the base resin, acid generator, and other components are soluble. Illustrative, non-limiting, examples of the organic solvent include ketones such as cyclopentanone, cyclohexanone, 4-methyl-2-pentanone and methyl amyl ketone; alcohols such as 3-methoxybutanol, 3-methyl-3-methoxybutanol, 1-methoxy-2-propanol, 1-ethoxy-2-propanol, propylene glycol monomethyl ether, ethylene glycol monomethyl ether, propylene glycol monoethyl ether, ethylene glycol monoethyl ether, n-propanol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol; ethers such as propylene glycol dimethyl ether, diethylene glycol dimethyl ether, methyl cyclopentyl ether, methyl cyclohexyl ether, anisole, diisopropyl ether, diisobutyl ether, diisopentyl ether, di-n-pentyl ether, methyl cyclopentyl ether, methyl cyclohexyl ether, di-n-butyl ether, di-sec-butyl ether, diisopentyl ether, di-sec-pentyl ether, di-tert-amyl ether, and di-n-hexyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; lactones such as γ-butyrolactone; and carbonates such as ethylene carbonate and propylene carbonate. These solvents may be used alone or in combination of two or more thereof. Of the above organic solvents, it is recommended to use propylene glycol monomethyl ether, PGMEA, cyclohexanone, γ-butyrolactone, ethyl lactate, and mixtures thereof because the base resin and acid generator are most soluble therein.

The amount of the organic solvent used may be determined in accordance with the desired film thickness or the like. An appropriate amount of the organic solvent is 200 to 15,000 parts, preferably 400 to 8,000 parts by weight per 100 parts by weight of the base resin.

A quencher may be optionally used in the resist composition of the invention. The term "quencher" as used herein has a meaning generally known in the art and refers to a compound capable of suppressing the rate of diffusion when the acid generated by the acid generator diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile. Examples of suitable quenchers include primary, secondary, and tertiary aliphatic amines, aromatic amines, heterocyclic amines, nitrogen-containing compounds with carboxyl group, nitrogen-containing compounds with hydroxyl group, N-oxides, amides, imides, carbamates, and ammonium salts.

The quencher is not particularly limited as long as it has at least one of the addition effects mentioned above. Use may be made of any of the basic compounds and nitrogen-containing organic compounds described in U.S. Pat. No. 7,537,880 (JP-A 2008-111103, paragraphs [0146] to [0163]).

Examples of the preferred quencher used in the resist composition are given below, but not limited thereto.

Suitable primary aliphatic amines include cetylamine and tetraethylenepentamine; suitable secondary aliphatic amines include didecylamine and didodecylamine; suitable tertiary aliphatic amines include trioctylamine, tridecylamine, tridodecylamine, and N,N-dicyclohexylmethylamine.

Examples of suitable aromatic and heterocyclic amines include aniline derivatives (e.g., N,N-bis(hydroxyethyl)-aniline and 2,6-diisopropylaniline), pyrrole derivatives, oxazole derivatives, thiazole derivatives, imidazole derivatives (e.g., 4-methyl-2-phenylimidazole and 2,4,5-triphenylimidazole), benzimidazole derivatives (e.g., benzimidazole, 2-methylbenzimidazole and 2-phenylbenzimidazole), pyrazole derivatives, furazane derivatives, pyrroline derivatives, pyrrolidine derivatives, imidazoline derivatives, imidazolidine derivatives, pyridine derivatives (e.g., dimethylaminopyridine and 2,6-di-tert-butyl-4-methylpyridine), as well as pyridazine, pyrimidine, pyrazine, pyrazoline, pyrazolidine, piperidine, piperazine, morpholine, indole, isoindole, 1H-indazole, indoline, quinoline, isoquinoline, cinnoline, quinazoline, quinoxaline, phthalazine, purine, pteridine, carbazole, phenanthridine, acridine, phenazine, 1,10-phenanthroline, adenine, adenosine, guanine, guanosine, uracil, and uridine derivatives.

Suitable nitrogen-containing compounds with carboxyl group include aminobenzoic acid derivatives (e.g., 4-dimethylaminobenzoic acid and 4-dibutylaminobenzoic acid) and amino acid derivatives. Suitable nitrogen-containing compounds with hydroxyl group include triethanolamine, triisopropanolamine, 4-(2-hydroxyethyl)morpholine, and 3-quinuclidinol. Suitable N-oxides include tributylamine-N-oxide, N-methylmorpholine-N-oxide, and tris(2-methoxymethoxyethyl)amine-N-oxide. Suitable amides include 1-cyclohexylpyrrolidone and N-pivaloyl-2-phenylbenzimidazole. Phthalimide is a typical imide. Suitable carbamates include N-tert-butoxycarbonyl-N,N-dicyclohexylamine, N-tert-butoxycarbonylbenzimidazole, N-tert-butoxycarbonyl-2-phenylimidazole, N-benzyloxycarbonyl-2-phenylbenzimidazole, and N-allyloxycarbonyl-2-phenylbenzimidazole.

Suitable ammonium salts include triethylammonium camphorsulfonate, tetrabutylammonium acetate, tetrabutylammonium p-toluenesulfonate, tetrabutylammonium 2,4,6-triisopropylbenzenesulfonate, tetrabutylammonium camphorsulfonate, benzyltrimethylammonium camphorsulfonate, trimethyloctadecylammonium 2,4,6-triisopropylbenzenesulfonate, and 4-(2-cyclohexanecarboxyethyl)morpholinium camphorsulfonate.

Other suitable quenchers include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris(2-acetoxyethyl)amine, tris(2-propionyloxyethyl)amine, tris(2-benzoyloxyethyl)amine, N,N-bis(2-acetoxyethyl)-2-(methoxycarbonyl)ethylamine, N,N-bis(2-methoxyethyl)-2-(methoxycarbonyl)ethylamine, 1-[2-(methoxymethoxy)ethyl]-2-phenylbenzimidazole, 1-dodecylpiperidine, 1-[2-[(2-methoxyethoxy)methoxy]ethyl]pyrrolidine, 4-dodecylmorpholine, 1-[2-[(2-methoxyethoxy)methoxy]ethyl]piperidine, 4-[2-[(2-methoxyethoxy)methoxy]ethyl]morpholine, 4-[2-[2-(2-methoxyethoxy)ethoxy]ethyl]morpholine, 1-[2-[2-(2-methoxyethoxy)ethoxy]ethyl]benzimidazole, 4-[2-[2-[2-(2-methoxyethoxy)ethoxy]ethoxy]ethyl]morpholine, 2-(1-pyrrolidinyl)ethyl acetate, 2-piperidinoethyl acetate, 2-morpholinoethyl acetate, 2-(1-imidazolyl)ethyl acetate, 2-(1-benzimidazolyl)ethyl acetate, 2-(2-phenyl-1-benzimidazolyl)ethyl acetate, 2-piperidinoethyl 2-(2-methoxyethoxy)acetate, 2-morpholinoethyl 2-(2-methoxyethoxy)acetate, 2-(1-benzimidazolyl)ethyl 2-(2-methoxyethoxy)acetate, 2-(2-phenyl-1-benzimidazolyl)ethyl 2-(2-methoxyethoxy)acetate, 2-(1-pyrrolidinyl)ethyl 2-[2-(2-methoxyethoxy)ethoxy]acetate, 2-piperidinoethyl 2-[2-(2-methoxyethoxy)ethoxy]acetate, 2-morpholinoethyl 2-[2-(2-methoxyethoxy)ethoxy]acetate, 2-(1-benzimidazolyl)ethyl 2-[2-(2-methoxyethoxy)ethoxy]acetate, 2-morpholinoethyl hexanoate, 2-morpholinoethyl octanoate, 2-morpholinoethyl decanoate, 2-morpholinoethyl laurate, 2-morpholinoethyl myristate, 2-morpholinoethyl palmitate, 2-morpholinoethyl stearate, 2-morpholinoethyl behenate, 2-morpholinoethyl cholate, 2-morpholinoethyl tris(O-acetyl)cholate, 2-morpholinoethyl tris(O-formyl)cholate, 2-morpholinoethyl dehydrocholate, 2-morpholinoethyl cyclopentanecarboxylate, 2-morpholinoethyl cyclohexanecarboxylate, 2-morpholinoethyl 2-naphthalenecarbonate, and 2-morpholinoethyl 7-oxanorbornane-2-carboxylate.

Also included are compounds having the general formula (E1).

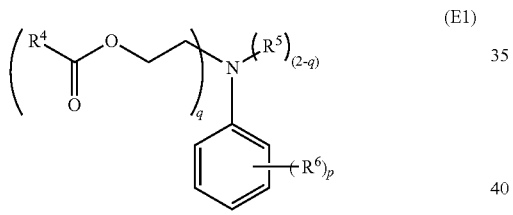

Herein $R^4$ is a $C_1$-$C_{20}$ alkyl or alkenyl group or an optionally substituted $C_6$-$C_{20}$ aryl or aralkyl group, which may contain a heteroatom; $R^5$ is a $C_1$-$C_{10}$ alkyl group; $R^6$ is a $C_1$-$C_{10}$ alkyl group or $C_1$-$C_{10}$ alkoxy group; q is 1 or 2, and p is an integer of 0 to 5.

In formula (E1), $R^4$ is a $C_1$-$C_{20}$ alkyl or alkenyl group or an optionally substituted $C_6$-$C_{20}$ aryl or aralkyl group, which may contain a heteroatom. Exemplary heteroatoms include oxygen, nitrogen, sulfur and halogen atoms. The alkyl groups may be straight, branched or cyclic while their carbon count should preferably range from 1 to 20 in order to obtain a satisfactory pattern profile. Illustrative, non-limiting examples of the group $R^4$ include methyl, ethyl, propyl, isopropyl, butyl, isobutyl, sec-butyl, tert-butyl, pentyl, neopentyl, cyclopentyl, hexyl, cyclohexyl, heptyl, 2-ethylhexyl, nonyl, undecyl, tridecyl, pentadecyl, heptadecyl, adamantyl, adamantylmethyl, norbornyl, norbornylmethyl, tricyclodecanyl, tetracyclododecanyl, tetracyclododecanylmethyl, dicyclohexylmethyl, eicosanyl, allyl, benzyl, diphenylmethyl, tetrahydrofuryl, methoxymethyl, ethoxymethyl, trifluoromethyl, (2-methoxyethoxy)methyl, acetoxymethyl, phenyl, naphthyl, tolyl, xylyl, trimethylphenyl, methoxyphenyl, methylthiophenyl, and acetamidophenyl. $R^5$ is a $C_1$-$C_{10}$ alkyl group. Illustrative, non-limiting examples of the group $R^5$ include methyl, ethyl, propyl, isopropyl, butyl, isobutyl, sec-butyl, tert-butyl, pentyl, neopentyl, cyclopentyl, hexyl, cyclohexyl, heptyl, 2-ethylhexyl, nonyl, and decyl. $R^6$ is a $C_1$-$C_{10}$ alkyl group or $C_1$-$C_{10}$ alkoxy group. Illustrative, non-limiting examples of the group $R^6$ include methyl, ethyl, propyl, isopropyl, butyl, isobutyl, sec-butyl, tert-butyl, pentyl, neopentyl, cyclopentyl, hexyl, cyclohexyl, heptyl, 2-ethylhexyl, nonyl, decyl, methoxy, ethoxy, propoxy, isopropoxy, butoxy, tert-butoxy, hexyloxy, cyclohexyloxy, and decyloxy. The subscript q is 1 or 2, and p is an integer of 0 to 5.

Illustrative, non-limiting examples of the compound having formula (E1) are given below.

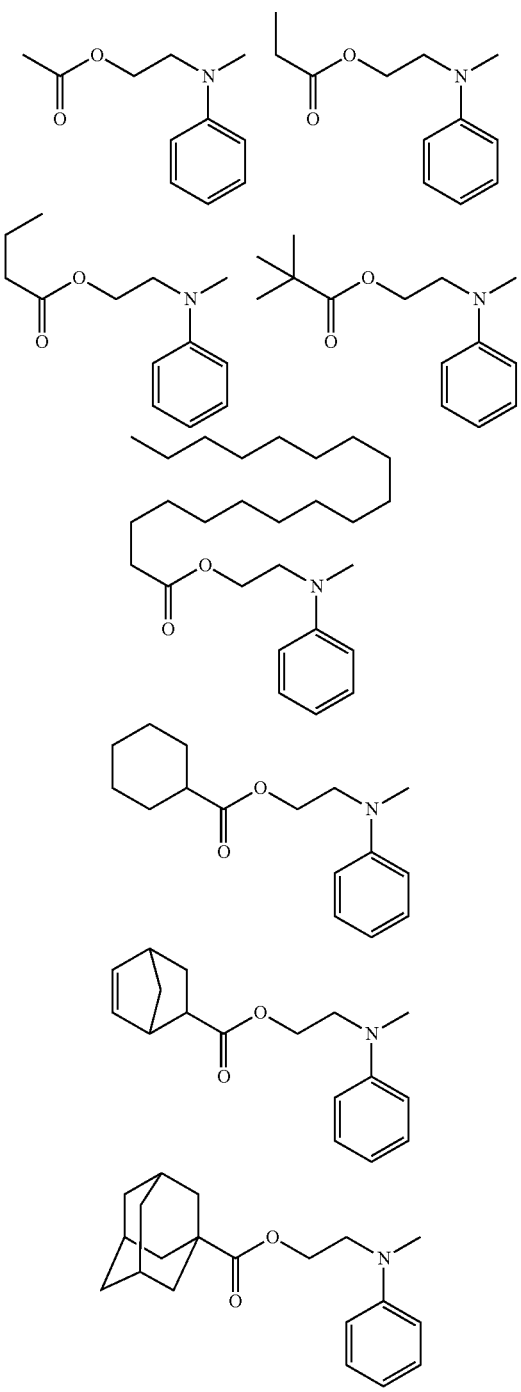

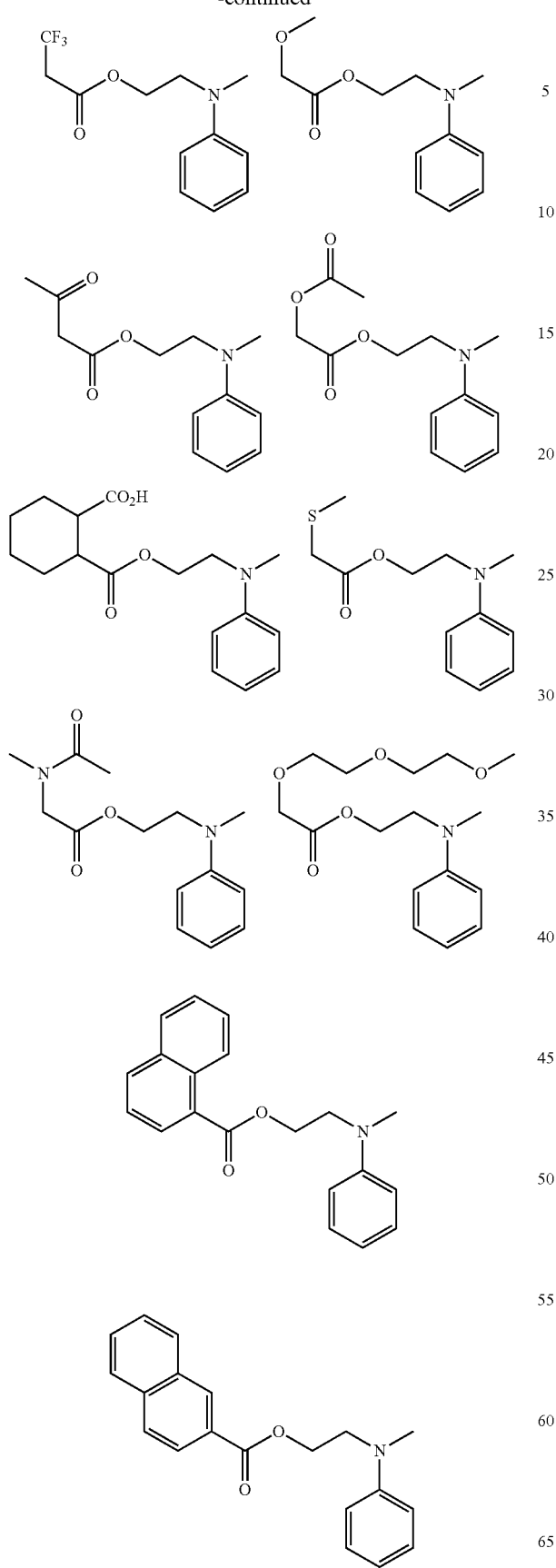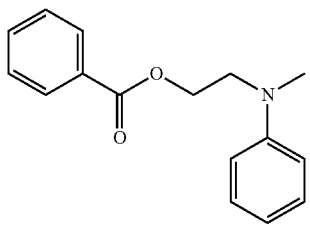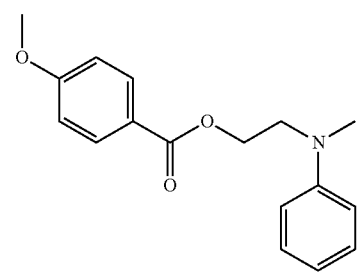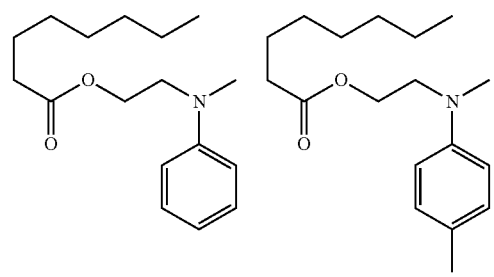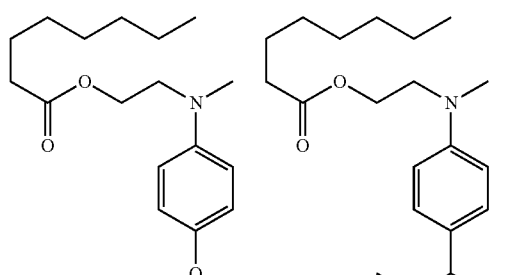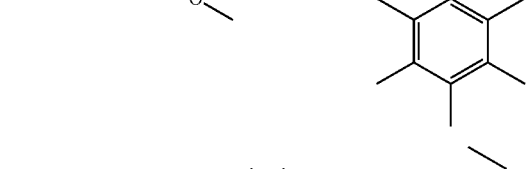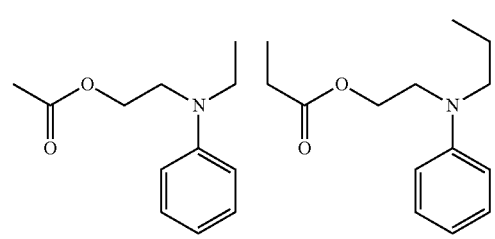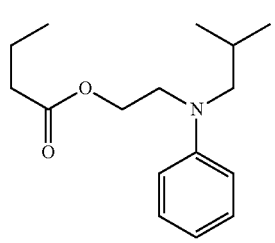

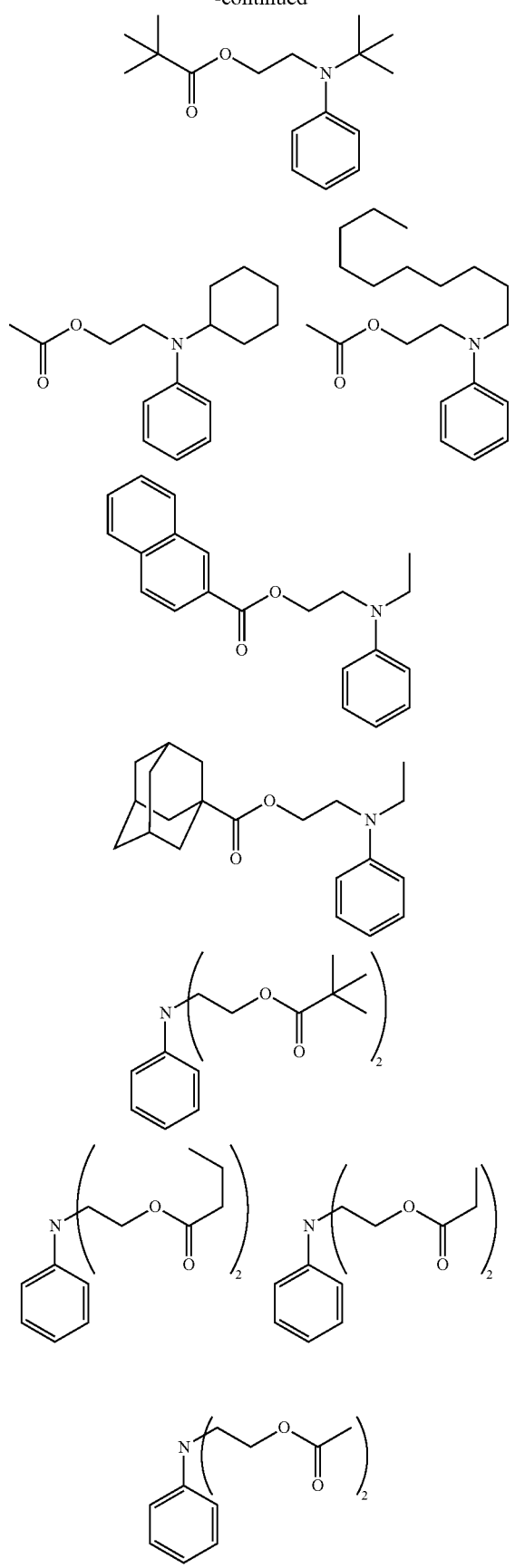
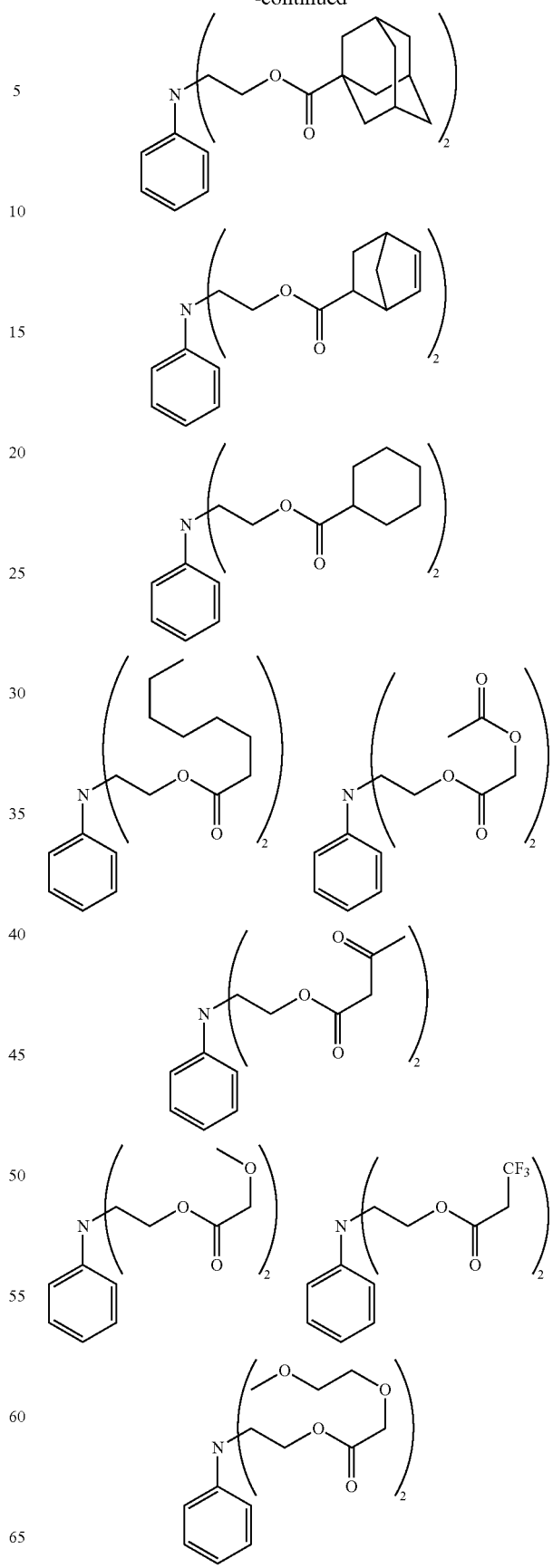

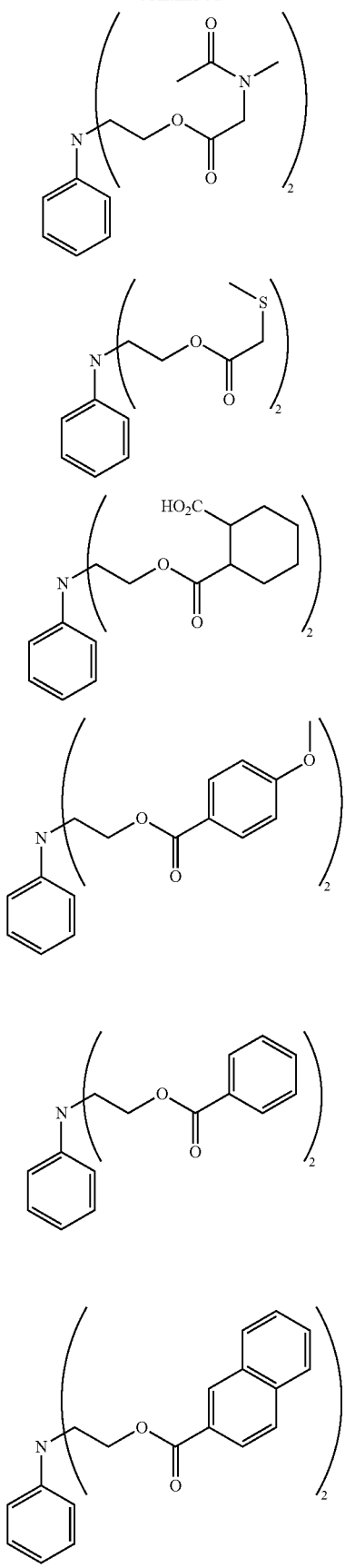
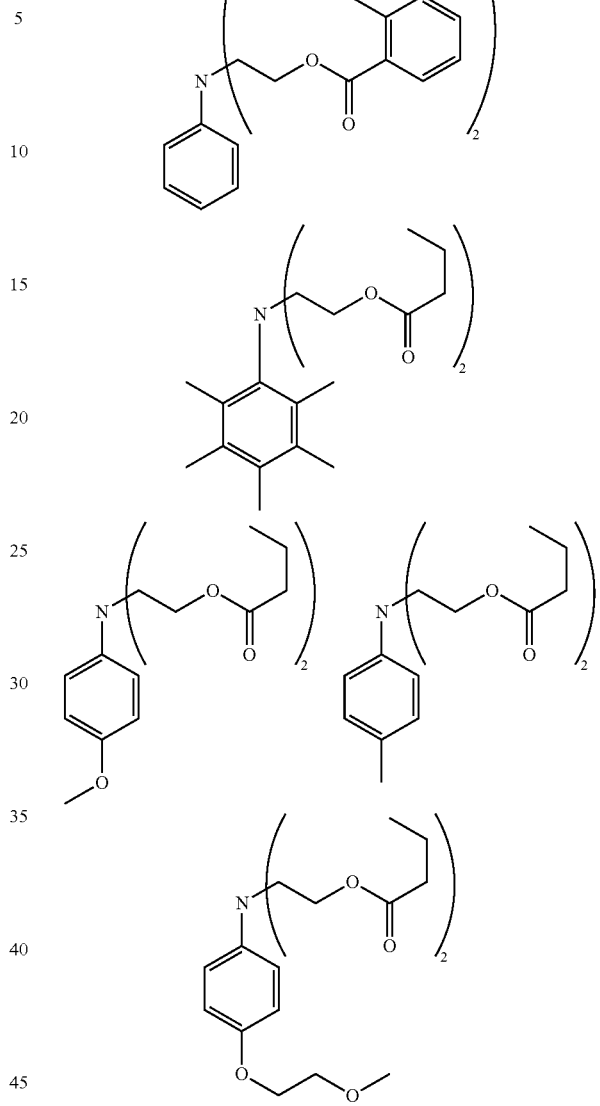

The quenchers may be used alone or in admixture of two or more. The quencher is preferably added in an amount of 0.01 to 20 parts, and especially 0.1 to 10 parts by weight, per 100 parts by weight of the entire base resin. Less than 0.01 part of the quencher may achieve no or little addition effect whereas more than 20 parts may result in too low a sensitivity.

Optionally, the resist composition of the invention may further comprise a surfactant. The surfactant used herein is generally divided into two groups, one group of surfactants (K1) which are commonly used for facilitating the coating operation and the other group of polymeric surfactants (K2) which are added to resist compositions that are processed by the immersion lithography using water without forming a resist protective film.

Examples of surfactant (K1) include, but are not limited to, nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (JEMCO Inc.), Megaface F171, F172, F173, R08, R30, R90 and R94 (DIC Corp.), Fluorad FC-430, FC-431, FC-4430 and FC-4432 (Sumitomo 3M Co., Ltd.), Asahiguard AG710, Surflon S-381, S-382, S-386, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.).

Additional useful surfactants include partially fluorinated oxetane ring-opened polymers having the structural formula (surf-1).

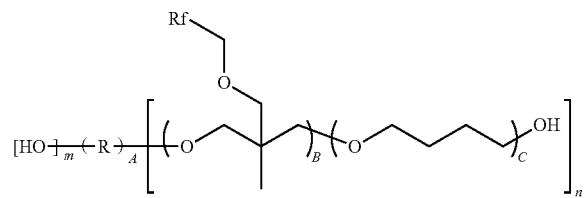

(surf-1)

It is provided herein that R, Rf, A, B, C, m, and n are applied to only formula (surf-1), independent of their descriptions other than for the surfactant. R is a di- to tetra-valent $C_2$-$C_5$ aliphatic group. Exemplary divalent groups include ethylene, 1,4-butylene, 1,2-propylene, 2,2-dimethyl-1,3-propylene and 1,5-pentylene. Exemplary tri- and tetra-valent groups are shown below.

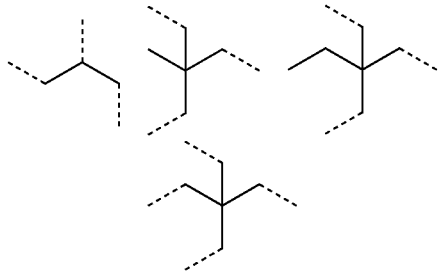

Herein the broken line denotes a valence bond. These formulae are partial structures derived from glycerol, trimethylol ethane, trimethylol propane, and pentaerythritol, respectively. Of these, 1,4-butylene and 2,2-dimethyl-1,3-propylene are preferably used.

Rf is trifluoromethyl or pentafluoroethyl, and preferably trifluoromethyl. The letter m is an integer of 0 to 3, n is an integer of 1 to 4, and the sum of m and n, which represents the valence of R, is an integer of 2 to 4. A is equal to 1, B is an integer of 2 to 25, and C is an integer of 0 to 10. Preferably, B is an integer of 4 to 20, and C is 0 or 1. Note that the above structural formula does not prescribe the arrangement of respective constituent units while they may be arranged either in blocks or randomly. For the preparation of surfactants in the form of partially fluorinated oxetane ring-opened polymers, reference should be made to U.S. Pat. No. 5,650,483, for example.

Of the foregoing surfactants, FC-4430, Surflon S-381, Surfynol E1004, KH-20, KH-30, and oxetane ring-opened polymers of formula (surf-1) are preferred. These surfactants may be used alone or in admixture.

In the resist composition, the surfactant (K1) is preferably compounded in an amount of up to 2 parts, and especially up to 1 part by weight, per 100 parts by weight of the base resin. The amount of the surfactant, if added, is preferably at least 0.01 part by weight.

The surfactant (K2) which is added to the resist composition has a function to segregate at the resist surface after spin coating to prevent or reduce water penetration into the resist film or leaching from the resist film. Any of many well-known compounds may be used as long as this function is met. This surfactant is a polymeric surfactant which is insoluble in water and soluble in an alkaline developer, and preferably improves water repellency and water slippage. Exemplary polymeric surfactants are those comprising monomeric units represented by the following formula.

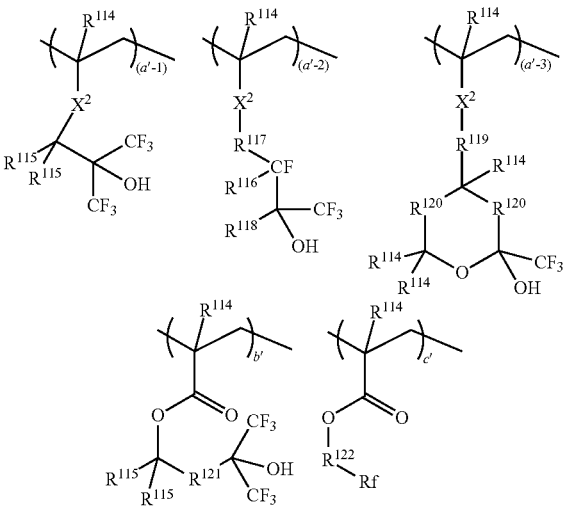

In the above formulae, $R^{114}$ is each independently hydrogen, fluorine, methyl or trifluoromethyl. $R^{115}$ is each independently hydrogen or a straight, branched or cyclic $C_1$-$C_{20}$ alkyl or fluoroalkyl group, or plural $R^{115}$ in a common unit may bond together to form a ring with the carbon atom to which they are attached, and in this case, they collectively stand for a straight, branched or cyclic alkylene or fluoroalkylene group having 2 to 20 carbon atoms in total. $R^{116}$ is fluorine or hydrogen, or $R^{116}$ may bond with $R^{117}$ to form a non-aromatic ring having 3 to 10 carbon atoms in total with the carbon atom to which they are attached. $R^{117}$ is a straight, branched or cyclic $C_1$-$C_6$ alkylene group in which one or more hydrogen atoms may be replaced by fluorine atoms. $R^{118}$ is a straight or branched $C_1$-$C_{10}$ alkyl group in which one or more hydrogen atoms are replaced by fluorine atoms, or $R^{117}$ and $R^{118}$ may bond together to form a non-aromatic ring with the carbon atoms to which they are attached, and in this case, they collectively stand for a trivalent organic group having 2 to 12 carbon atoms in total. $R^{119}$ is a single bond or a $C_1$-$C_4$ alkylene group. $R^{120}$ is each independently a single bond, —O— or —$CR^{114}R^{114}$— wherein $R^{114}$ is as defined above. $R^{121}$ is a straight or branched $C_1$-$C_4$ alkylene group, or $R^{121}$ may bond with $R^{115}$ within a common unit to form a non-aromatic ring having 3 to 6 carbon atoms in total with the carbon atom to which they are attached. $R^{122}$ is 1,2-ethylene, 1,3-propylene or 1,4-butylene. Rf is a straight perfluoroalkyl group of 3 to 6 carbon atoms, or 3H-perfluoropropyl, 4H-perfluorobutyl, 5H-perfluoropentyl or 6H-perfluorohexyl. $X^2$ is each independently —C(=O)—O—, —O—, or —C(=O)—$R^{123}$—C(=O)—O— wherein $R^{123}$ is a straight, branched or cyclic $C_1$-$C_{10}$ alkylene group. The subscripts are numbers in the range: $0 \leq (a'-1) < 1$, $0 \leq (a'-2) < 1$, $0 \leq (a'-3) < 1$, $0 < (a'-1)+(a'-2)+(a'-3) < 1$, $0 \, b' < 1$, $0 \leq c' < 1$, and $0 < (a'-1)+(a'-2)+(a'-3)+b'+c' \leq 1$.

As the surfactant (K2), the polymers described in JP-A 2010-134012 may also be used.

When added to the resist composition, the polymeric surfactant (K2) is preferably used in an amount of 0.001 to 20 parts, and more preferably 0.01 to 10 parts by weight, per 100 parts by weight of the base resin.

Optionally, the resist composition may further comprise any of well-known dissolution regulators, acetylene alcohols, acidic compounds, dyes, thermal crosslinkers, stabilizers and the like. Of these, the dissolution regulators and acetylene alcohols are described in US 20080090172 (JP-A 2008-122932, paragraphs [0155] to [0178] and [0179] to [0182]).

Process

As alluded previously, the pattern forming process of the invention comprises the steps of coating the resist composition defined above onto a substrate, prebaking the resist composition to form a resist film, exposing a selected region of the resist film to high-energy radiation, baking (PEB), and developing the exposed resist film in an organic solvent-based developer so that the unexposed region of resist film is dissolved and the exposed region of resist film is left, thereby forming a negative tone pattern such as a hole or trench pattern.

FIG. 1 illustrates the pattern forming process of the invention. First, the resist composition is coated on a substrate to form a resist film thereon. Specifically, a resist film 40 of a resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Figure 1B:
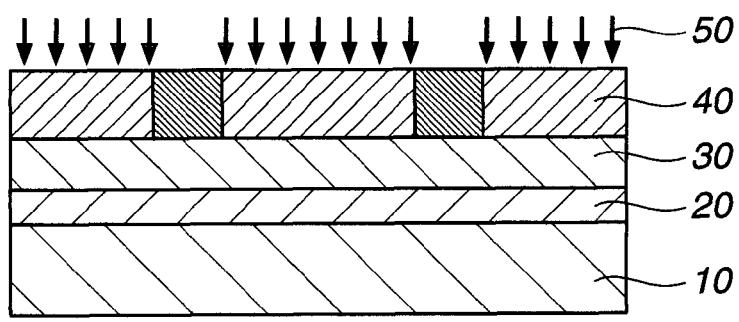
FIG. 1B shows the resist film being exposed.

Next comes exposure depicted at 50 in FIG. 1B. For the exposure, preference is given to high-energy radiation having a wavelength of 140 to 250 nm, EUV having a wavelength of 13.5 nm, and electron beam (EB), and especially ArF excimer laser radiation of 193 nm wavelength. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues (which is soluble in alcohol and other solvents that do not attack the resist film, but insoluble in water), in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in the organic solvent developer. In particular, protective film-forming materials having 1,1,1,3,3,3-hexafluoro-2-propanol residues as described in JP-A 2007-025634 and 2008-003569 readily dissolve in the organic solvent-based developer.

Therefore, the other embodiment is a pattern forming process comprising the steps of applying a resist composition comprising a polymer comprising recurring units capable of forming a lactone ring under the action of an acid, an acid generator, and an organic solvent onto a substrate, prebaking the composition to form a resist film, forming a protective film on the resist film, exposing the resist film to high-energy radiation, baking, and applying an organic solvent-based developer to dissolve away the protective film and the unexposed region of the resist film for forming a negative pattern wherein the exposed region of film is not dissolved.

Exposure is preferably performed in an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Figure 1C:
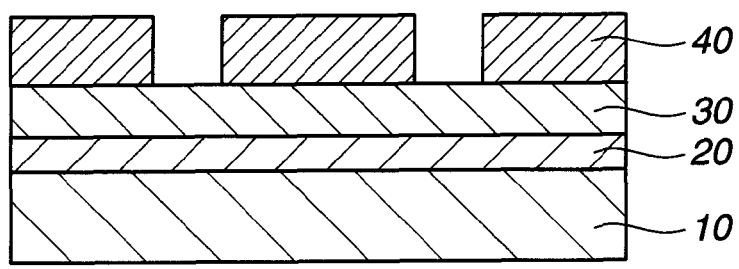
FIG. 1C shows the resist film being developed in an organic solvent.

Thereafter the exposed resist film is developed with an organic solvent-based developer for 0.1 to 3 minutes, preferably 0.5 to 2 minutes by any conventional techniques such as dip, puddle and spray techniques. In this way, the unexposed region of resist film is dissolved away, leaving a negative resist pattern 40 on the substrate 10 as shown in FIG. 1C.

The organic solvent used as the developer is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone; and esters such as propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. The solvents may be used alone or in admixture. Besides the foregoing solvents, aromatic solvents may be used, for example, toluene, xylene, ethylbenzene, isopropylbenzene, tert-butylbenzene and mesitylene.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent.

Monomer Synthesis Example

Synthesis Example 1

Synthesis of Polymerizable Ester Compound (M1)

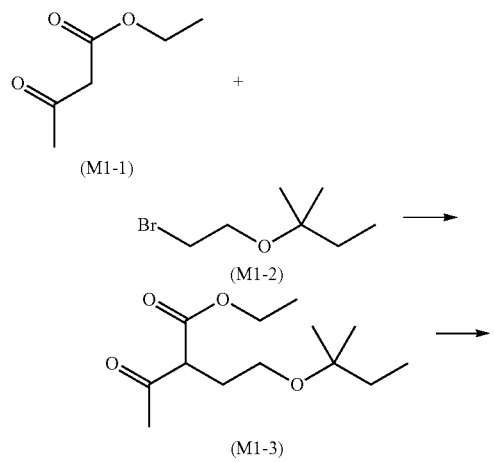

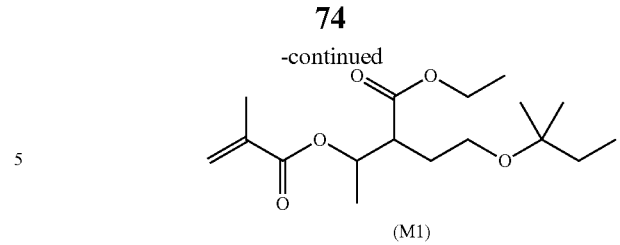

With stirring in a water bath, 8.2 g of potassium t-butoxide was added to a mixture of 10.9 g of compound (M1-1), 12.0 g of compound (M1-2), and 30 g of N-methylpyrrolidone. The contents were stirred for 30 minutes and then for 16 hours at 45° C. Then 100 g of toluene and 1.3 g of acetic acid were added to stop the reaction, followed by aqueous work-up and distillation (boiling point 67° C./8 Pa) for purification. There was obtained 9.6 g of intermediate (M1-3).

With ice cooling and stirring, a mixture of 770 mg of sodium borohydride and 10 g of water was added dropwise to a mixture of 12.2 g of intermediate (M1-3) and 40 g of tetrahydrofuran. The contents were stirred for 1 hour. Then 2.4 g of acetone was added to stop the reaction. This was followed by addition of 100 g of toluene, aqueous work-up, and concentration in vacuum to 68 g. To the concentrate were added 6.4 g of pyridine, 250 mg of 4-dimethylaminopyridine, and 7.8 g of methacrylic anhydride. The contents were stirred at 50° C. for 20 hours. This was followed by aqueous work-up and distillation (boiling point 89-97° C./13 Pa) for purification. Polymerizable ester compound (M1), 8.7 g, was obtained as a mixture of two diastereomers which were in a ratio of 56:44 on $^1$H-NMR analysis.

IR (D-ATR): ν=2975, 2933, 2879, 1733, 1721, 1638, 1463, 1380, 1364, 1318, 1295, 1239, 1175, 1086, 942 cm$^{-1}$ $^1$H-NMR (600 MHz/DMSO-d$_6$): δ=0.77 (1.3H, t, J=7.4 Hz), 0.77 (1.7H, t, J=7.3 Hz), 1.02 (1.3H, s), 1.02 (1.7H, s), 1.14 (1.7H, t, J=7.3 Hz), 1.16 (1.3H, t, J=7.4 Hz), 1.20 (0.9H, d, J=6.4 Hz), 1.21 (1.1H, d, J=5.9 Hz), 1.38 (0.9H, q, J=7.4 Hz), 1.38 (1.1H, q, J=7.5 Hz), 1.60-1.68 (1H, m), 1.70-1.80 (1H, m), 1.83 (1.7H, br.s), 1.85 (1.3H, br.s), 2.67-2.75 (1H, m), 3.17-3.29 (2H, m), 4.00-4.10 (2H, m), 4.98 (0.6H, dq, J=7.9, 5.9 Hz), 5.05 (0.4H, dq, J=6.0, 6.4 Hz), 5.64 (0.6H, m), 5.66 (0.4H, m), 5.97 (0.6H, m), 5.99 (0.4H, m)

GC-MS (EI): (m/z)$^+$=25, 41, 69, 86, 113, 141, 157, 183, 199, 227, 243, 285

Reference Experiment 1

Acid Treatment of Polymerizable Ester Compound (M1)

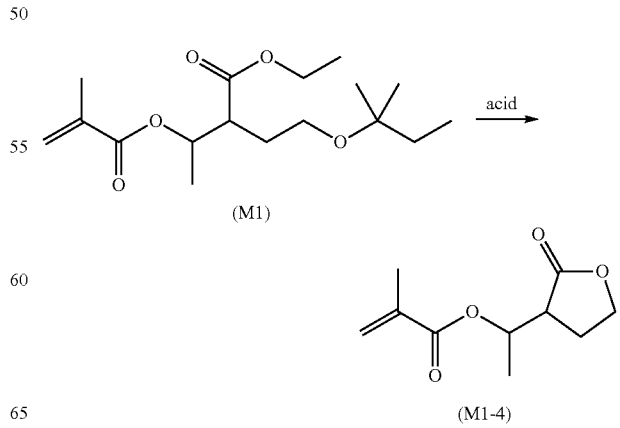

In a reactor, 100 mg of polymerizable ester compound (M1), 20 mg of Amberlyst® 15 (sulfonic acid cation-exchange resin), and 2 g of toluene were stirred at 80° C. for 1 hour. On GC-MS analysis, the product was identified to be lactone compound (M1-4).

GC-MS (EI): (m/z)$^+$=27, 41, 55, 69, 85, 95, 113, 129, 139, 154, 168, 183, 198 (M$^+$)

The result of this experiment proves that the polymerizable ester compound within the scope of the invention forms a lactone ring under the action of acid. It is thus believed that a resist film based on a polymer comprising recurring units derived from this ester compound also forms a lactone ring under the action of acid through a similar reaction mechanism.

Synthesis Example 2

Synthesis of Polymerizable Ester Compound (M2)

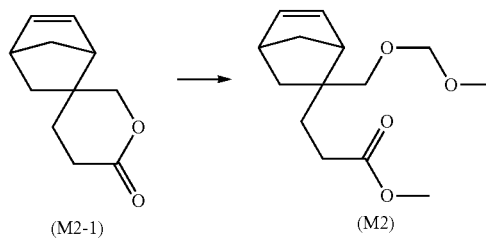

A mixture of 17.8 g of compound (M2-1), 200 g of methanol, and 0.5 g of sodium methoxide was heated and stirred for 20 hours. The reaction solution was neutralized with acetic acid, combined with 200 g of toluene, and concentrated in vacuum to 100 g. 100 g of acetonitrile, 25 g of diisopropylethylamine, and 12 g of chloromethyl methyl ether were added to the concentrate, which was stirred at 60° C. for 20 hours. The solution was subjected to aqueous work-up and purified by silica gel chromatography, obtaining 13.0 g of polymerizable ester compound (M2).

Polymer Synthesis Example

Synthesis Example 3

Synthesis of Resist Polymer (P1)

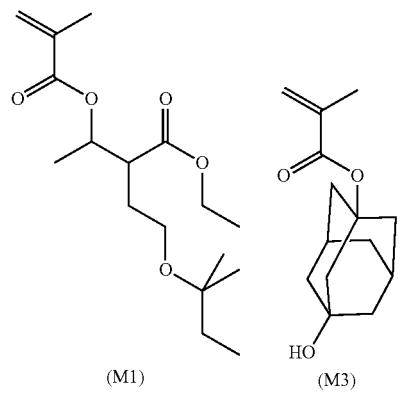

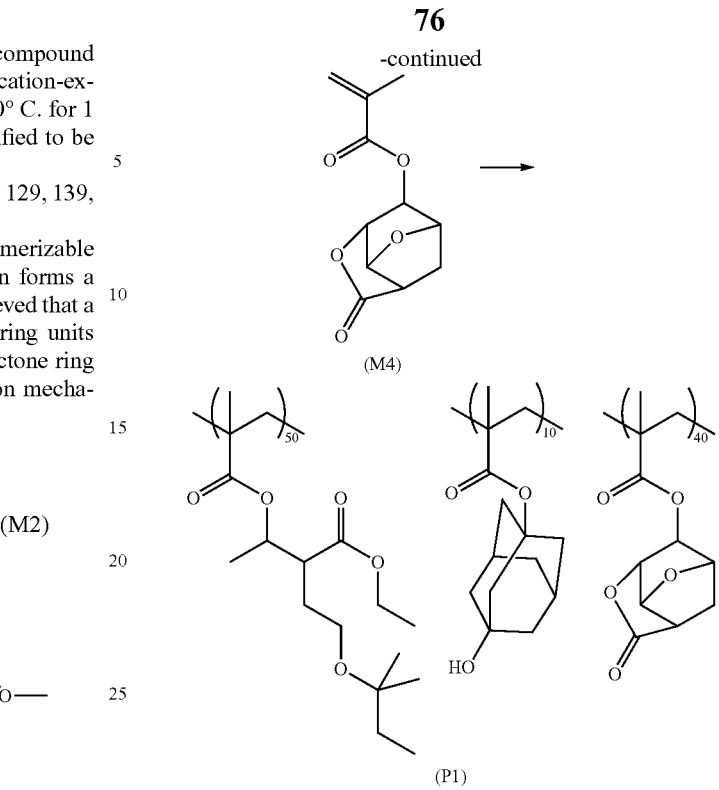

With stirring at 80° C., a mixture of 6.12 g of compound (M1), 0.87 g of compound (M3), 3.32 g of compound (M4), 0.43 g of dimethyl 2,2-azobis(2-methylpropionate), and 15.0 g of 2-butanone was added dropwise to 8.3 g of 2-butanone over 3 hours. Stirring was continued at 80° C. for a further 2 hours. The reaction solution was cooled to room temperature and added to 100 g of hexane with stirring. The resulting polymer solid was collected by filtration, washed with a mixture of 4 g of 2-butanone and 56 g of hexane, and dried at 50° C./200 Pa for 16 hours, obtaining 7.9 g of polymer (P1). Mw=13,300, Mw/Mn=1.82.

Synthesis Example 4

Synthesis of Resist Polymer (P2)

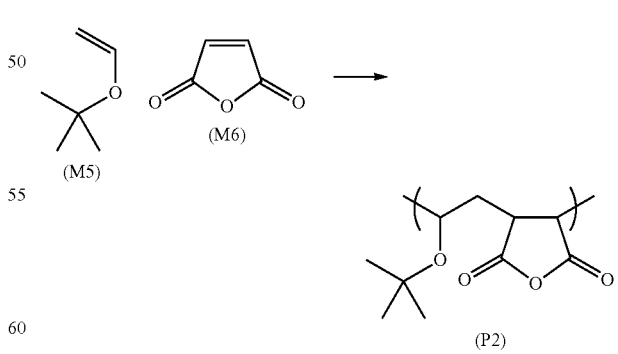

With stirring at 80° C., a mixture of 10.3 g of compound (M5), 9.9 g of compound (M6), 2.3 g of dimethyl 2,2-azobis (2-methylpropionate), and 13 g of PGMEA was added dropwise to 7 g of PGMEA over 3 hours. Stirring was continued at 80° C. for a further 2 hours. The reaction solution was cooled to room temperature and added to 200 g of hexane with stirring. The resulting polymer solid was collected by filtration, washed with 120 g of hexane, and dried at 50° C./200 Pa for 20 hours, obtaining 20.0 g of polymer (P2). Mw=41,400, Mw/Mn=5.02.

Synthesis Example 5

Synthesis of Resist Polymer (P3)

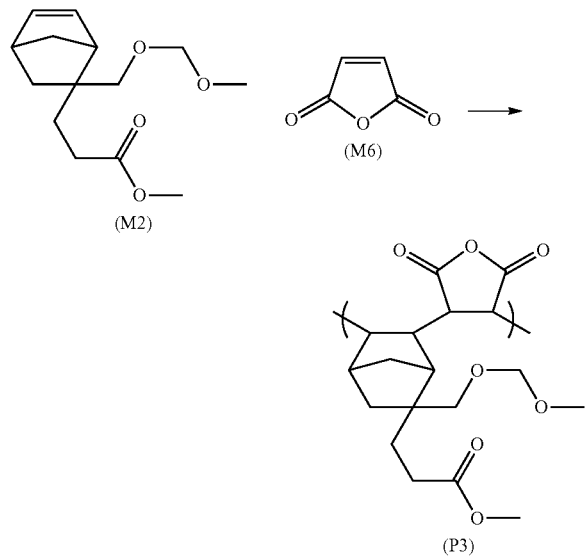

At 60° C., 1.9 g of 2,2-azobis(2,4-dimethylvaleronitrile) was added to a mixture of 32.3 g of compound (M2), 12.5 g of compound (M6), and 17 g of PGMEA. The contents were stirred for 20 hours. The reaction solution was cooled to room temperature, combined with 6 g of acetone, and added to 2,000 g of 2-propanol with stirring. The resulting polymer solid was collected by filtration, washed with 200 g of 2-propanol, and dried at 50° C./200 Pa for 20 hours, obtaining 17.2 g of polymer (P3). Mw=3,300, Mw/Mn=2.16.

Comparative Synthesis Examples 1 and 2

Synthesis of Comparative Resist Polymers (CP1) and (CP2)

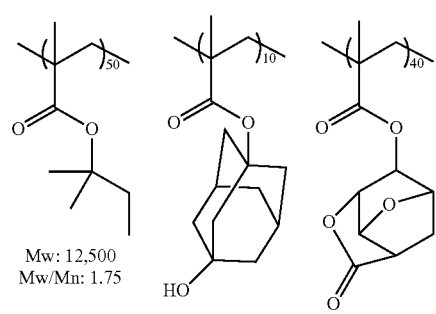

(CP1)
Mw: 12,500
Mw/Mn: 1.75

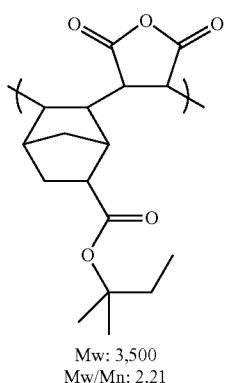

(CP2)
Mw: 3,500
Mw/Mn: 2.21

Comparative resist polymers (CP1) and (CP2) were synthesized according to the procedures of Synthesis Examples 3 and 5.

Examples and Comparative Examples

Preparation of Resist Composition

A resist composition in solution form was prepared by dissolving a polymer (of Synthesis Example) and components in solvents in accordance with the formulation of Tables 1 and 3 and filtering through a Teflon® filter with a pore size of 0.2 µm. The components are identified below.

Acid generator: PAG1 and PAG2 of the following structural formulae

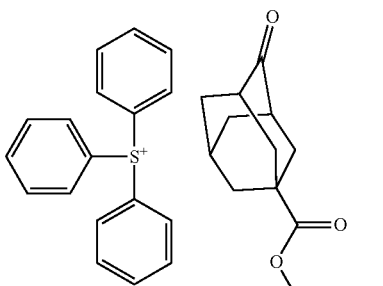

PAG 1

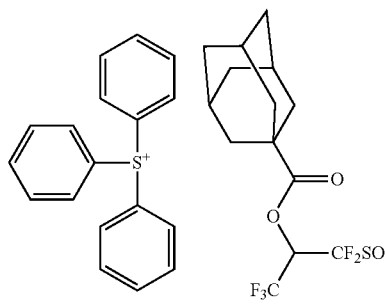

PAG 2

Water-Repellent Polymer 1
Mw=8,900
Mw/Mn=1.89

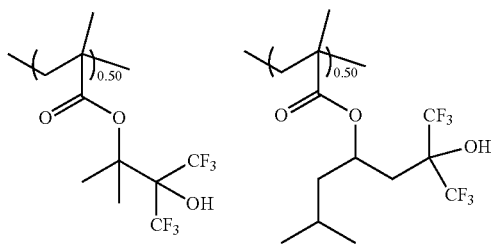

Basic Compound: Q1 and Q2 of the following structural formulae

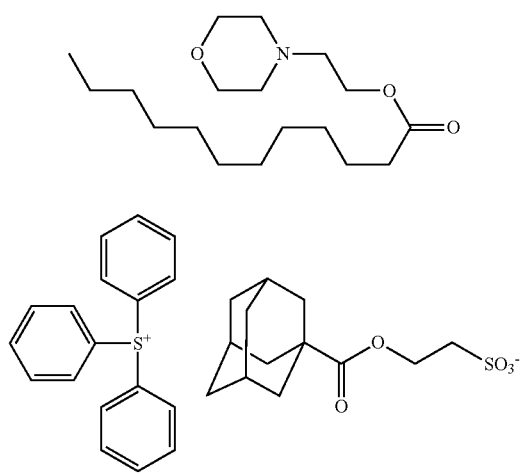

Q1

Q2

Organic Solvent:

PGMEA (propylene glycol monomethyl ether acetate)

CyH (cyclohexanone)

ArF Lithography Patterning Test 1

On a substrate (silicon wafer) having an antireflective coating (Nissan Chemical Industries, Ltd.) of 80 nm thick, the resist composition in Table 1 was spin coated and baked on a hot plate at 100° C. for 60 seconds to form a resist film of 160 nm thick.

Using an ArF excimer laser scanner NSR-307E (Nikon Corp., NA 0.85, σ 0.93), the resist film was exposed to a line-and-space pattern. The exposed resist film was baked (PEB) at 100° C. for 60 seconds and puddle developed for 60 seconds in an organic solvent developer as shown in Table 1. The wafer was rinsed at 500 rpm with a rinse liquid (organic solvent) as shown in Table 1, spin dried at 2,000 rpm, and baked at 100° C. for 60 seconds to evaporate off the rinse liquid, forming a 80-nm 1:1 line-and-space pattern.

The resist pattern was observed under an electron microscope. The optimum dose Eop was an exposure dose (mJ/cm$^2$) that provided a trench width of 80 nm. A range of dose which provided a size difference within 8 nm from the desired size was determined, and designated "permissible dose range." Exposure latitude (EL, %)=(permissible dose range)/(optimum dose)×100 was computed (with a higher value being better). The cross-sectional profile of the pattern printed at the optimum dose was observed. The profile is judged "pass" if the pattern sidewall is perpendicular and the profile is rectangular, and "fail" if the profile is inversely tapered or the sub-surface layer is blocked. The results are shown in Table 2.

TABLE 1

| | | Polymer (pbw) | Acid generator (pbw) | Basic compound (pbw) | Organic solvent (pbw) | Developer | Rinse liquid |
|---|---|---|---|---|---|---|---|
| Example | | | | | | | |
| 1-1 | Resist 1-1 | P1 (100) | PAG1 (6.5) | Q1 (1.50) | PGMEA (800) CyH (400) | butyl acetate | 4-methyl-2-pentanol |
| 1-2 | Resist 1-2 | P1 (100) | PAG1 (6.5) | Q1 (1.50) | PGMEA (800) CyH (400) | 2-heptanone | diisoamyl ether |
| 1-3 | Resist 1-3 | P2 (100) | PAG1 (6.5) | Q1 (1.50) | PGMEA (800) CyH (400) | butyl acetate | 4-methyl-2-pentanol |
| 1-4 | Resist 1-4 | P3 (100) | PAG2 (6.5) | Q2 (1.50) | PGMEA (800) CyH (400) | butyl acetate | 4-methyl-2-pentanol |
| Comparative Example | | | | | | | |
| 1-1 | Comparative Resist 1-1 | CP1 (100) | PAG1 (6.5) | Q1 (1.50) | PGMEA (800) CyH (400) | butyl acetate | 4-methyl-2-pentanol |
| 1-2 | Comparative Resist 1-2 | CP2 (100) | PAG1 (6.5) | Q1 (1.50) | PGMEA (800) CyH (400) | butyl acetate | 4-methyl-2-pentanol |

TABLE 2

|  |  | EL (%) | Profile |
|---|---|---|---|
| Example | 1-1 | 15.3 | pass |
|  | 1-2 | 13.6 | pass |
|  | 1-3 | 14.0 | pass |
|  | 1-4 | 13.5 | pass |
| Comparative Example | 1-1 | 8.9 | fail |
|  | 1-2 | 4.4 | fail |

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition in Table 3 was spin coated, then baked on a hot plate at 100° C. for 60 seconds to form a resist film of 100 nm thick.

Figure 2:
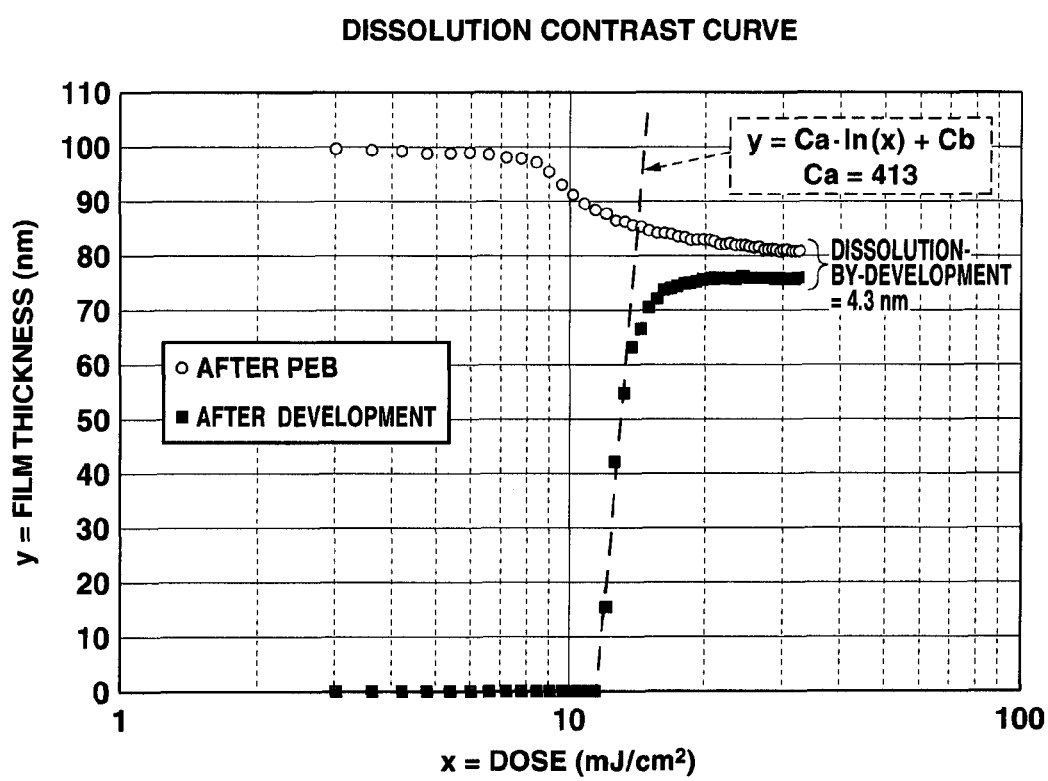
FIG. 2 graphically illustrates how to evaluate the dissolution contrast of a resist film upon organic solvent development, with a higher dissolution contrast being indicated by a higher gradient (=Ca) of the broken line or a less dissolution-by-development.

Using an ArF excimer laser immersion lithography scanner NSR-610C (Nikon Corp., NA 1.30, σ 0.98), open-frame exposure was performed in a dose that varied stepwise by 0.2 mJ/cm². After the exposure, the wafer was baked (PEB) at 100° C. for 60 seconds and puddle developed in an organic solvent developer (butyl acetate) for 60 seconds. The wafer was rinsed with an organic solvent rinse liquid (diisoamyl ether) at 500 rpm, spin dried at 2,000 rpm, and baked at 100° C. for 60 seconds to evaporate off the rinse liquid. The film thickness was measured after PEB and after organic solvent development, from which a relationship (contrast curve) of film thickness versus dose was determined. FIG. 2 shows the contrast curves after PEB and after development in Example 2-1. For those plots falling in the film thickness range from 10 nm to 60 nm on the contrast curve after development, logarithmic approximate curve-fitting y=Ca·ln(x)+Cb was determined wherein x=dose (mJ/cm²), y=film thickness (nm), Ca and Cb are constants. Also, at the over-dose (32 mJ/cm²), a difference between film thickness after PEB and film thickness after development was determined and reported as dissolution-by-development (nm). The Ca value and dissolution-by-development in Examples and Comparative Examples are shown in Table 4. A higher value of Ca and a less dissolution-by-development indicate a higher contrast, with a higher resolution being expectable.

TABLE 3

|  |  | Polymer (pbw) | Acid generator (pbw) | Basic compound (pbw) | Additive (pbw) | Organic solvent (pbw) |
|---|---|---|---|---|---|---|
| Example |  |  |  |  |  |  |
|  | 2-1 | Resist 2-1 | P1 (100) | PAG2 (12.0) | Q1 (1.50) | Water-repellent Polymer 1 (3) | PGMEA (2,000) CyH (500) |
|  | 2-2 | Resist 2-2 | P2 (100) | PAG2 (12.5) | Q1 (1.50) | Water-repellent Polymer 1 (3) | PGMEA (2,000) CyH (500) |
|  | 2-3 | Resist 2-3 | P3 (100) | PAG2 (12.5) | Q1 (1.50) | Water-repellent Polymer 1 (3) | PGMEA (2,000) CyH (500) |
|  | 2-4 | Resist 2-4 | P1 (50) CP1 (50) | PAG2 (12.5) | Q1 (1.50) | Water-repellent Polymer 1 (3) | PGMEA (2,000) CyH (500) |
| Comparative Example |  |  |  |  |  |  |
|  | 2-1 | Comparative Resist 2-1 | CP1 (100) | PAG2 (12.5) | Q1 (1.50) | Water-repellent Polymer 1 (3) | PGMEA (2,000) CyH (500) |
|  | 2-2 | Comparative Resist 2-2 | CP2 (100) | PAG2 (12.5) | Q1 (1.50) | Water-repellent Polymer 1 (3) | PGMEA (2,000) CyH (500) |

TABLE 4

|  |  | Ca | Dissolution-by-development (nm) |
|---|---|---|---|
| Example | 2-1 | 413 | 4.3 |
|  | 2-2 | 465 | 2.4 |
|  | 2-3 | 390 | 6.2 |
|  | 2-4 | 365 | 9.8 |
| Comparative Example | 2-1 | 277 | 14.5 |
|  | 2-2 | 163 | 42.1 |

It is demonstrated that the chemically amplified resist composition of the invention is suited to form a negative pattern through organic solvent development and exhibits a high dissolution contrast on organic solvent development.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2011-273949 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of applying a resist composition comprising a polymer adapted to undergo deprotection reaction under the action of an acid, to form a hydroxyl group, which in turn, reacts with any neighboring ester to form a lactone ring so that the polymer may reduce its solubility in an organic solvent developer, an acid generator, and an organic solvent onto a substrate, prebaking the composition to form a resist film, exposing the resist film to high-energy radiation, baking, and developing the exposed film in an organic solvent-based developer to form a negative pattern wherein the unexposed region of film is dissolved away and the exposed region of film is not dissolved, wherein said polymer comprises recurring units of at least one type selected from the general formulae (1) and (2):

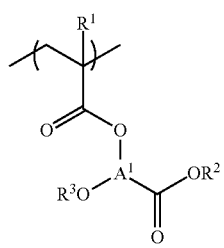

(1)

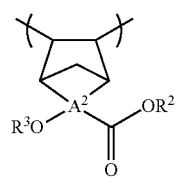

(2)

wherein $R^1$ is hydrogen or methyl, $R^2$ is a $C_1$-$C_{20}$ alkyl group which may contain an oxygen functional group, $R^3$ is a $C_2$-$C_{20}$ acid labile group which may contain an oxygen functional group, $A^1$ is a trivalent $C_3$-$C_{20}$ organic group which may contain an oxygen functional group, and $A^2$ is a tetravalent $C_3$-$C_{20}$ organic group which may contain an oxygen functional group.

2. The process of claim 1 wherein the developer comprises at least one organic solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

3. The process of claim 1 wherein the step of exposing the resist film to high-energy radiation includes ArF excimer laser lithography of 193 nm wavelength, EUV lithography of 13.5 nm wavelength or EB lithography.

4. A negative pattern-forming resist composition comprising a polymer, an acid generator, and an organic solvent, said polymer being dissolvable in a developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate, and said polymer being adapted to undergo deprotection reaction under the action of an acid, to form a hydroxyl group, which in turn, reacts with any neighboring ester to form a lactone ring so that the polymer may reduce its solubility in the organic solvent developer, wherein said polymer comprises recurring units of at least one type selected from the general formulae (1) and (2):

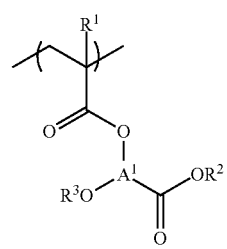

(1)

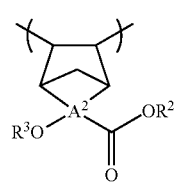

(2)

wherein $R^1$ is hydrogen or methyl, $R^2$ is a $C_1$-$C_{20}$ alkyl group which may contain an oxygen functional group, $R^3$ is a $C_2$-$C_{20}$ acid labile group which may contain an oxygen functional group, $A^1$ is a trivalent $C_3$-$C_{20}$ organic group which may contain an oxygen functional group, and $A^2$ is a tetravalent $C_3$-$C_{20}$ organic group which may contain an oxygen functional group.

* * * * *